US012767908B2

(12) United States Patent
Sugimura et al.

(10) Patent No.: US 12,767,908 B2
(45) Date of Patent: Oct. 20, 2026

(54) TREATMENT LIQUID, CLEANING METHOD OF SEMICONDUCTOR SUBSTRATE, AND MANUFACTURING METHOD OF SEMICONDUCTOR ELEMENT

(71) Applicant: FUJIFILM Corporation, Tokyo (JP)

(72) Inventors: Nobuaki Sugimura, Haibara-gun (JP); Tetsuya Kamimura, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 273 days.

(21) Appl. No.: 18/526,588

(22) Filed: Dec. 1, 2023

(65) Prior Publication Data

US 2024/0117278 A1 Apr. 11, 2024

Related U.S. Application Data

(63) Continuation of application No. PCT/JP2022/021584, filed on May 26, 2022.

(30) Foreign Application Priority Data

Jun. 2, 2021 (JP) ................................ 2021-092788

(51) Int. Cl.

| | |
|---|---|
| ***C11D 1/60*** | (2006.01) |
| ***C11D 1/62*** | (2006.01) |
| ***C11D 1/72*** | (2006.01) |
| ***C11D 3/00*** | (2006.01) |
| ***C11D 3/26*** | (2006.01) |
| ***C11D 3/30*** | (2006.01) |
| ***C11D 3/34*** | (2006.01) |
| ***C11D 3/36*** | (2006.01) |
| ***H10P 70/00*** | (2026.01) |

(52) U.S. Cl.

CPC .............. *C11D 3/30* (2013.01); *C11D 3/0047* (2013.01); *C11D 3/3472* (2013.01); *H10P 70/237* (2026.01); *H10P 70/277* (2026.01); *C11D 2111/22* (2024.01); *C11D 2111/44* (2024.01)

(58) Field of Classification Search

CPC .... C11D 1/60; C11D 1/62; C11D 1/72; C11D 3/2041; C11D 3/2068; C11D 3/26; C11D 3/30; C11D 3/34; C11D 3/36; H01L 21/02065; H01L 21/02074

See application file for complete search history.

(56) References Cited

U.S. PATENT DOCUMENTS

| | | | | |
|---|---|---|---|---|
| 10,351,809 | B2 | 7/2019 | Thomas et al. | |
| 2018/0037852 | A1* | 2/2018 | Thomas | B08B 3/08 |

FOREIGN PATENT DOCUMENTS

| | | | |
|---|---|---|---|
| JP | 2007027382 | A | 2/2007 |
| JP | 2014154625 | A | 8/2014 |
| JP | 2018503723 | A | 2/2018 |
| TW | 201634683 | A | 10/2016 |
| WO | 2006107475 | A1 | 10/2006 |

OTHER PUBLICATIONS

International Search Report (PCT/ISA/210) dated Aug. 16, 2022 issued by the International Searching Authority in International Application No. PCT/JP2022/021584.

Written Opinion (PCT/ISA/237) dated Aug. 16, 2022 issued by the International Searching Authority in International Application No. PCT/JP2022/021584.

International Preliminary Report on Patentability (with translation of Written Opinion) dated Nov. 21, 2023 issued in International Application No. PCT/JP2022/021584.

Office Action issued Nov. 11, 2025 in Japanese Patent Application No. 2023-525770.

Office Action issued Sep. 9, 2025 in Taiwanese Patent Application No. 111120052.

Office Action dated Feb. 13, 2026 in Taiwanese Application No. 111120052.

* cited by examiner

*Primary Examiner* — Brian P Mruk

(74) *Attorney, Agent, or Firm* — Sughrue Mion, PLLC

(57) ABSTRACT

An object of the present invention is to provide a treatment liquid having excellent removability of a hydrophobic anti-corrosion agent and excellent suppression property of copper surface roughness, a cleaning method of a semiconductor substrate, and a manufacturing method of a semiconductor element. The treatment liquid of the present invention contains at least one specific compound selected from the group consisting of a quaternary ammonium compound including a quaternary ammonium cation having a total number of carbon atoms of 5 or more and a quaternary phosphonium compound including a quaternary phosphonium cation having a total number of carbon atoms of 5 or more, a sulfur-containing compound, and a solvent.

18 Claims, No Drawings

TREATMENT LIQUID, CLEANING METHOD OF SEMICONDUCTOR SUBSTRATE, AND MANUFACTURING METHOD OF SEMICONDUCTOR ELEMENT

CROSS-REFERENCE TO RELATED APPLICATIONS

This application is a Continuation of PCT International Application No. PCT/JP2022/021584 filed on May 26, 2022, which claims priority under 35 U.S.C. § 119(a) to Japanese Patent Application No. 2021-092788 filed on Jun. 2, 2021. The above applications are hereby expressly incorporated by reference, in their entirety, into the present application.

BACKGROUND OF THE INVENTION

1. Field of the Invention

The present invention relates to a treatment liquid, a cleaning method of a semiconductor substrate, and a manufacturing method of a semiconductor element.

2. Description of the Related Art

A treatment liquid is used for the purpose of removing foreign substances and the like in various fields, and is used, for example, in the following applications in the semiconductor field.

Semiconductor elements such as a charge-coupled device (CCD) and a memory are manufactured by forming a fine electronic circuit pattern on a substrate using a photolithographic technique. Specifically, the semiconductor elements are manufactured by forming a resist film on a laminate which has a metal film serving as a wiring line material, an etching stop layer, and an interlayer insulating layer on a substrate, and carrying out a photolithography step and a dry etching step (for example, a plasma etching treatment).

In the manufacture of the semiconductor element, a chemical mechanical polishing (CMP) treatment in which a surface of a semiconductor substrate having a metal wiring line film, a barrier metal, an insulating film, or the like is flattened using a polishing slurry containing a hydrophobic anticorrosion agent (for example, a benzotriazole compound such as 5-methylbenzotriazole), polishing fine particles (for example, silica and alumina), or the like may be carried out. In the CMP treatment, the hydrophobic anticorrosion agent, the polishing fine particles to be used in the CMP treatment, a polished wiring line metal film, and/or a metal component derived from the barrier metal or the like easily remain on the surface of the semiconductor substrate after polishing. Since these residues can short-circuit wiring lines and affect electrical characteristics of a semiconductor, a cleaning step in which these residues are removed from the surface of the semiconductor substrate is generally carried out. In particular, the hydrophobic anticorrosion agent is often used in a state-of-the-art device manufacturing process.

As a treatment liquid used in the cleaning step, for example, WO2006/107475A discloses a treatment liquid containing an alkanolamine, quaternary ammonium, and water.

SUMMARY OF THE INVENTION

In a case where the treatment liquid disclosed in WO2006/107475A is applied to the substrate having the hydrophobic anticorrosion agent remaining on the surface of the substrate and having copper, the present inventors have found that it is difficult to achieve both removal of hydrophobic anticorrosion agent (hereinafter, also referred to as "removability of hydrophobic anticorrosion agent") and non-roughening of copper surface (hereinafter, also referred to as "suppression property of copper surface roughness").

An object of the present invention is to provide a treatment liquid having excellent removability of a hydrophobic anticorrosion agent and excellent suppression property of copper surface roughness. Another object of the present invention is to provide a cleaning method of a semiconductor substrate and a manufacturing method of a semiconductor element.

The present inventor has found that the above-described objects can be achieved by the following configurations.

[1] A treatment liquid comprising:

at least one specific compound selected from the group consisting of a quaternary ammonium compound including a quaternary ammonium cation having a total number of carbon atoms of 5 or more and a quaternary phosphonium compound including a quaternary phosphonium cation having a total number of carbon atoms of 5 or more;

a sulfur-containing compound; and a solvent.

[2] The treatment liquid according to [1], in which the specific compound has any one of a cation represented by Formula (1) described later or a cation represented by Formula (2) described later.

[3] The treatment liquid according to [2], in which $R^{11}$ to $R^{14}$ in Formula (1) each independently represent an unsubstituted alkyl group.

[4] The treatment liquid according to any one of [1] to [3], in which the specific compound is an ethyltrimethylammonium salt.

[5] The treatment liquid according to [1], in which the specific compound includes at least quaternary ammonium cation selected from the group consisting of a quaternary ammonium compound including a quaternary ammonium cation having a total number of carbon atoms of 8 or more and a quaternary phosphonium compound including a quaternary phosphonium cation having a total number of carbon atoms of 8 or more.

[6] The treatment liquid according to any one of [1] to [5], in which a mass ratio of the specific compound to the sulfur-containing compound is more than 1.0.

[7] The treatment liquid according to any one of [1] to [6], in which the sulfur-containing compound includes at least one selected from the group consisting of a thiol compound and a salt of the thiol compound, a thioether compound, a thioketone compound, a thiourea compound, a disulfide compound, a polysulfide compound, and a sulfur-containing heterocyclic compound.

[8] The treatment liquid according to any one of [1] to [7], in which the sulfur-containing compound includes at least one selected from the group consisting of a thiol compound and a salt of the thiol compound, and a thiourea compound.

[9] The treatment liquid according to any one of [1] to [8], in which the sulfur-containing compound includes at least one selected from the group consisting of cysteine, cysteamine, N-acetylcysteine, thioglycerol, mercaptopropionic acid, mercaptosuccinic acid, meso-2,3-dimercaptosuccinic acid, mercaptotriazole, and tetramethylthiourea.

[10] The treatment liquid according to any one of [1] to [9], in which the sulfur-containing compound includes cysteine.

[11] The treatment liquid according to any one of [1] to [10], further comprising:

at least one compound X selected from the group consisting of a glycol compound, a monoalkyl ether compound, and an alkylene oxide compound.

[12] The treatment liquid according to [11], in which the compound X includes at least one selected from the group consisting of ethylene glycol, propylene glycol, 1,3-butanediol, and 2-butoxyethanol.

[13] The treatment liquid according to or [12], in which a mass ratio of the sulfur-containing compound to the compound X is 0.1 to 10.0.

[14] The treatment liquid according to any one of [1] to [13], further comprising:

an amine compound.

[15] The treatment liquid according to [14], in which the amine compound includes at least one selected from the group consisting of monoethanolamine and methyldiethanolamine.

[16] The treatment liquid according to or [15], in which a mass ratio of the sulfur-containing compound to the amine compound is 1.0 to 10.0.

[17] The treatment liquid according to any one of [1] to [16], in which a pH of the treatment liquid is 8.0 to 14.0.

[18] The treatment liquid according to any one of [1] to [17], in which the treatment liquid is used for cleaning a semiconductor substrate which has been subjected to a chemical mechanical polishing treatment.

[19] A cleaning method of a semiconductor substrate, comprising:

a cleaning step of cleaning a semiconductor substrate which has been subjected to a chemical mechanical polishing treatment using the treatment liquid according to any one of [1] to [18].

[20] A manufacturing method of a semiconductor element, comprising:

the cleaning method of a semiconductor substrate according to [19].

According to the present invention, it is possible to provide a treatment liquid having excellent removability of a hydrophobic anticorrosion agent and excellent suppression property of copper surface roughness. In addition, according to the present invention, it is possible to provide a cleaning method of a semiconductor substrate and a manufacturing method of a semiconductor element.

DESCRIPTION OF THE PREFERRED EMBODIMENTS

Hereinafter, an example of forms for carrying out the present invention will be described.

The meaning of each notation in the present specification is shown below.

A numerical range represented using "to" means a range including numerical values described before and after the preposition "to" as a lower limit and an upper limit.

"ppm" means "parts-per-million (10-6)", and "ppb" means "parts-per-billion (10-9)".

"psi" means pound-force per square inch, where 1 psi=6, 894.76 Pa.

In a case where there are two or more components corresponding to a certain component, "content" of such a component means the total content of the two or more components.

Unless otherwise specified, compounds described in the present specification may include structural isomers, optical isomers, and isotopes. In addition, one kind of structural isomer, optical isomer, and isotope may be included, or two or more kinds thereof may be included.

A bonding direction of a divalent group cited (for example, —COO—) is not limited unless otherwise specified. For example, in a case where Y in a compound represented by a formula "X—Y—Z" is —COO—, the compound may be "X—O—CO—Z" or "X—OO—O—Z".

"(Meth)acryl" includes both acryl and methacryl, and "(meth)acrylate)" includes both acrylate and methacrylate.

"Weight-average molecular weight" means a weight-average molecular weight in terms of polyethylene glycol measured by gel permeation chromatography (GPC).

A phrase "on the semiconductor substrate" encompasses, for example, front and back surfaces, a side surface, and the inside of a groove of the semiconductor substrate. In addition, a metal-containing substance on the semiconductor substrate encompasses not only a case where the metal-containing substance is directly on the surface of the semiconductor substrate but also a case where the metal-containing substance is present on the semiconductor substrate through another layer.

In the present specification, "total mass of components in the treatment liquid excluding a solvent" means the total content of all components contained in the treatment liquid other than a solvent such as water and an organic solvent.

[Treatment Liquid]

The treatment liquid contains at least one specific compound selected from the group consisting of a quaternary ammonium compound including a quaternary ammonium cation having a total number of carbon atoms of 5 or more and a quaternary phosphonium compound including a quaternary phosphonium cation having a total number of carbon atoms of 5 or more;

a sulfur-containing compound; and a solvent.

A mechanism by which the objects of the present invention are achieved through the above-described configuration is not always clear, but is presumed by the present inventors to be as follows.

It has been known that a hydrophobic anticorrosion agent interacts strongly with a metal (for example, copper) and is easily adsorbed, which makes it difficult to remove the hydrophobic anticorrosion agent with a treatment liquid in the related art. On the other hand, in the treatment liquid according to the embodiment of the present invention, which contains the specific compound and the sulfur-containing compound, it is presumed that these compounds interact to improve affinity with the hydrophobic anticorrosion agent, resulting in excellent removability of the hydrophobic anticorrosion agent. In addition, it is presumed that suppression property of a copper surface roughness is also excellent by adjusting copper dissolving ability.

Hereinafter, the fact that at least one effect of the removability of the hydrophobic anticorrosion agent or the suppression property of the copper surface roughness is more excellent is also referred to that the effect of the present invention is more excellent.

Hereinafter, each component contained in the treatment liquid will be described.

[Specific Compound]

The treatment liquid contains the specific compound.

The specific compound is at least one compound selected from the group consisting of a quaternary ammonium compound including a quaternary ammonium cation having a total number of carbon atoms of 5 or mores and a quaternary phosphonium compound including a quaternary phosphonium cation having a total number of carbon atoms of 5 or more.

The above-described total number of carbon atoms is the sum of the number of carbon atoms in the quaternary ammonium cation included in the quaternary ammonium compound, or the sum of the number of carbon atoms in the quaternary phosphonium cation included in the quaternary phosphonium compound.

In other words, the above-described quaternary ammonium compound includes, as a cation, a quaternary ammonium cation having a total number of carbon atoms of 5 or more. The above-described quaternary phosphonium compound includes, as a cation, a quaternary phosphonium cation having a total number of carbon atoms of 5 or more. As will be described later, the specific compound may include an anion in addition to the above-described cation. The above-described anion is not particularly limited.

As one of suitable aspects of the specific compound, it is preferable that the specific compound includes at least quaternary ammonium cation selected from the group consisting of a quaternary ammonium compound including a quaternary ammonium cation having a total number of carbon atoms of 8 or more and a quaternary phosphonium compound including a quaternary phosphonium cation having a total number of carbon atoms of 8 or more.

The upper limit of the total number of carbon atoms in the quaternary ammonium cation and the total number of carbon atoms in the quaternary phosphonium cation is preferably 30 or less, more preferably 20 or less, and still more preferably 10 or less.

The above-described quaternary ammonium compound is a compound consisting of an ammonium cation having a total number of carbon atoms of 5 or more and an anion. The above-described quaternary phosphonium compound is a compound consisting of a phosphonium cation having a total number of carbon atoms of 5 or more and an anion.

The above-described quaternary ammonium compound and the above-described quaternary phosphonium compound may have two or more of the above-described cations, or may have two or more of anions.

The above-described anion may be any of a monovalent anion or a di or higher-valent anion.

Examples of the above-described anion include an organic anion and an inorganic anion. Specific examples thereof include an acid anion such as a carboxylate ion, a phosphate ion, a sulfate ion, a phosphonate ion, and a nitrate ion; a hydroxide ion; and a halide ion such as a chloride ion, a fluoride ion, and a bromide ion, and a hydroxide ion is preferable.

The above-described ammonium cation is a cation including a nitrogen atom to which four substituents are bonded. In addition, the above-described phosphonium cation is a cation including a phosphorus atom to which four substituents are bonded.

Examples of the above-described substituent include a halogen atom such as a fluorine atom, a chlorine atom, and a bromine atom, a hydroxy group, and an organic group.

As the above-described substituent, a hydrocarbon group which may have a substituent or may have —O— is preferable.

The number of carbon atoms in the above-described hydrocarbon group is preferably 1 to 30, more preferably 1 to 10, and still more preferably 1 to 5.

Examples of the above-described hydrocarbon group include an alkyl group which may have a substituent or may have —O—, an alkenyl group which may have a substituent or may have —O—, an alkynyl group which may have a substituent or may have —O—, an aryl group which may have a substituent or may have —O—, and a group obtained by combining these groups, and an alkyl group which may have a substituent or may have —O— is preferable.

Examples of the substituent included in the above-described hydrocarbon group include a halogen atom such as a fluorine atom, a chlorine atom, and a bromine atom; an alkoxy group; a hydroxy group; an alkoxycarbonyl group such as a methoxycarbonyl group and an ethoxycarbonyl group; an acyl group such as an acetyl group, a propionyl group, and benzoyl group; a cyano group; and a nitro group, and a hydroxy group is preferable. In addition, the substituent included in the above-described hydrocarbon group may be the above-described ammonium cation or the above-described phosphonium cation.

The alkyl group, the alkenyl group, and the alkynyl group described above may be linear, branched, or cyclic.

The number of carbon atoms in the alkyl group, the alkenyl group, and the alkynyl group described above is preferably 1 to 30, more preferably 1 to 10, still more preferably 1 to 5, and particularly preferably 1 to 3.

As the above-described alkyl group, an unsubstituted alkyl group or an alkyl group which has a hydroxy group and may have —O— is preferable, and an unsubstituted alkyl group or an alkyl group which has a hydroxy group is more preferable.

The unsubstituted alkyl group is an alkyl group which does not have a substituent (for example, a hydroxy group) and —O— (for example, a methyl group and an ethyl group). The above-described aryl group may be monocyclic or polycyclic.

The number of carbon atoms in the above-described aryl group is preferably 6 to 20, more preferably 6 to 10, and still more preferably 6 to 8.

As the above-described aryl group, an unsubstituted aryl group (aryl group which does not have a substituent and —O—) or an aryl group having a hydroxy group is preferable, and an unsubstituted aryl group is more preferable.

The unsubstituted aryl group is an aryl group which does not have a substituent and —O— (for example, a phenyl group and a naphthyl group).

Examples of the above-described aryl group include a benzyl group, a phenyl group, a naphthyl group, an anthryl group, a phenanthryl group, an indenyl group, an acenaphthenyl group, a fluorenyl group, and a pyrenyl group, and a phenyl group is preferable.

It is preferable that the four substituents included on the nitrogen atom of the above-described ammonium cation or on the phosphorus atom of the above-described phosphonium cation represent at least two or more kinds of groups.

In addition, it is preferable that at least two of the four substituents included on the nitrogen atom of the above-described ammonium cation or on the phosphorus atom of the above-described phosphonium cation represent the same group, it is more preferable that at least three of the four substituents represent the same group.

As another suitable aspect of the specific compound, it is preferable that the specific compound has any one of a cation represented by Formula (1) or a cation represented by Formula (2).

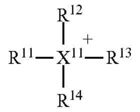

(1)

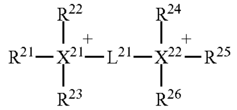

(2)

In Formula (1), $X^{11}$ represents a nitrogen atom or a phosphorus atom, $R^{11}$ to $R^{14}$ each independently represent an alkyl group which may have a substituent and may have —O—, here, a case where all of $R^{11}$ to $R^{14}$ represent the same group is excluded, and a total number of carbon atoms in $R^{11}$ to $R^{14}$ is 5 or more.

$X^{11}$ represents a nitrogen atom or a phosphorus atom.

$X^{11}$ is preferably a nitrogen atom.

$R^{11}$ to $R^{14}$ each independently represent an alkyl group which may have a substituent and may have —O—.

The above-described alkyl group may be linear, branched, or cyclic.

The number of carbon atoms in the above-described alkyl group is preferably 1 to 20, more preferably 1 to 10, still more preferably 1 to 5, and particularly preferably 1 to 3.

Examples of the above-described substituent include a hydroxy group, a carboxy group, and a halogen atom (for example, a fluorine atom, a chlorine atom, and a bromine atom), and a hydroxy group is preferable.

As $R^{11}$ to $R^{14}$, an unsubstituted alkyl group (alkyl group which does not have a substituent and —O—) is preferable, and an unsubstituted alkyl group having 1 to 3 carbon atoms is more preferable.

However, a case where all of $R^{11}$ to $R^{14}$ represent the same group is excluded. For example, in a case where all of to $R^{14}$ represent a methyl group, because $R^{11}$ to $R^{14}$ are the same group, the requirement of "a case where all of $R^{11}$ to $R^{14}$ represent the same group is excluded" is not satisfied. On the other hand, in a case where all of $R^{11}$ to Rn are methyl groups and $R^{14}$ is an ethyl group, because not all $R^{11}$ to $R^{14}$ are the same group, the requirement of "a case where all of $R^{11}$ to $R^{14}$ represent the same group is excluded" is satisfied. In a case where at least either the type of the substituent or the type of the alkyl group is different, the groups are not the same group. That is, in a case where two groups differ from each other in terms of at least either the type of substituent or the type of the alkyl group, the groups are regarded as different groups. For example, because there is a difference in overall structure between an ethyl group and a hydroxyethyl group, these groups are not the same group.

In other words, the "a case where all of $R^{11}$ to $R^{14}$ represent the same group is excluded" means that four groups represented by $R^{11}$ to $R^{14}$ represent at least two kinds of groups. For example, in the case where all of $R^{11}$ to $R^{13}$ are methyl groups and $R^{14}$ is an ethyl group, four groups represented by $R^{11}$ to $R^{14}$ represent two types of groups, a methyl group and an ethyl group.

Examples of an aspect of $R^{11}$ to $R^{14}$ include an aspect in which, in four groups represented by $R^{11}$ to $R^{14}$, three groups represented by $R^{11}$ to $R^{13}$ are the same group and one group represented by $R^{14}$ is a group different from the three groups. Examples thereof also include an aspect in which, in four groups represented by $R^{11}$ to $R^{14}$, two groups represented by $R^{11}$ and $R^{12}$ are the same group, two groups represented by $R^{13}$ and $R^{14}$ are the same group, and the group represented by $R^{11}$ and $R^{12}$ is different from the group represented by $R^{13}$ and $R^{14}$. In addition, all of four groups represented by $R^{11}$ to $R^{14}$ may be different groups.

The total number of carbon atoms in $R^{11}$ to $R^{14}$ is 5 or more, preferably 5 to 24, more preferably 5 to 16, and still more preferably 5 to 8.

The total number of carbon atoms in $R^{11}$ to $R^{14}$ means the sum of the number of carbon atoms included in each group represented by $R^{11}$ to $R^{14}$.

In Formula (2), $X^{21}$ and $X^{22}$ each independently represent a nitrogen atom or a phosphorus atom, $L^{21}$ represents a divalent linking group, $R^{21}$ to $R^{26}$ each independently represent an alkyl group which may have a substituent and may have —O—, and a total number of carbon atoms in $R^{21}$ to $R^{26}$ and $L^{21}$ is 6 or more.

$X^{21}$ and $X^{22}$ each independently represent a nitrogen atom or a phosphorus atom.

$X^{21}$ and $X^{22}$ are preferably a nitrogen atom. In addition, it is also preferable that $X^{21}$ and $X^{22}$ represent the same group.

$L^{21}$ represents a divalent linking group.

Examples of $L^{21}$ include —COO—, —CONH—, —CO—, —O—, an alkylene group, an alkenylene group, an arylene group, and a group obtained by combining these groups.

The above-described divalent linking group may further have a substituent. Examples of the above-described substituent include a hydroxy group, a carboxy group, and a halogen atom (for example, a fluorine atom, a chlorine atom, and a bromine atom).

The above-described alkylene group may be linear, branched, or cyclic, and is preferably linear or branched.

The number of carbon atoms in the above-described alkylene group is preferably 1 to 20, more preferably 1 to 15, and still more preferably 1 to 10.

The above-described arylene group may be monocyclic or polycyclic, and is preferably monocyclic.

The number of carbon atoms in the above-described arylene group is preferably 6 to 20 and more preferably 6 to 10.

$R^{21}$ to $R^{26}$ each independently represent an alkyl group which may have a substituent and may have —O—.

Examples of $R^{21}$ to $R^{26}$ include the alkyl groups represented by $R^{11}$ to $R^{14}$.

All of $R^{21}$ to $R^{26}$ may represent the same group, or $R^{21}$ to $R^{26}$ may represent different groups. In other words, all of six groups represented by $R^{21}$ to $R^{26}$ may be the same group, or six groups represented by $R^{21}$ to $R^{26}$ may be at least two kinds of groups. Among these, it is preferable that six groups represented by $R^{21}$ to $R^{26}$ are at least two kinds of groups.

The total number of carbon atoms in $R^{21}$ to $R^{26}$ and $L^{21}$ is 6 or more, preferably 6 to 30, more preferably 6 to 18, and still more preferably 6 to 8.

The total number of carbon atoms in $R^{21}$ to $R^{26}$ and $L^{21}$ means the sum of the number of carbon atoms included in each group represented by $R^{21}$ to $R^{26}$ and $L^{21}$.

Examples of the quaternary ammonium compound including the quaternary ammonium cation having a total number of carbon atoms of 5 or more include ethyltrimethylammonium hydroxide, tetraethyl ammonium hydroxide, tetrapropylammonium hydroxide, tetrabutylammonium hydroxide, 2-hydroxyethyltrimethylammonium hydroxide, trihydroxyethylmethylammonium hydroxide, tri ((hydroxyethoxy)ethyl)methylammonium hydroxide, dimethyldioctadecylammonium chloride, N,N'-ethylenebis(trimethylammonium), decamethonium bromide, 1,3-dihydroxypropyltrimethylammonium hydroxide, and $N^1$-(1-hydroxy-2-methylpropan-2-yl)-$N^2$-(2-hydroxypropyl)-$N^1$,$N^1$,—$N^2$,$N^2$,2-pentamethylpropane-1,2-diaminium dihydroxide.

Examples of the quaternary phosphonium compound including the quaternary phosphonium cation having a total number of carbon atoms of 5 or more include tetrabutylphosphonium hydroxide, tetraphenylphosphonium bromide, heptyltriphenylphosphonium bromide, and methyltriphenylphosphonium iodide.

The anion in the exemplary compound of the above-described specific compound may be an anion other than the above. The above-described anion is as described above. For example, the decamatonium bromide may be either decamatonium hydroxide or decamatonium iodide.

In addition, examples of the specific compound also include compounds described in WO2020/214692A, the content of which is incorporated herein by reference.

As the specific compound, the quaternary ammonium compound including the quaternary ammonium cation having a total number of carbon atoms of 5 or more is preferable, and an ethyltrimethylammonium salt is more preferable.

A molecular weight of the specific compound is preferably 105 to 260, more preferably 105 to 204, and still more preferably 105 to 150.

A Clog P of the specific compound is usually −4.60 to 20.0, preferably −4.60 to 1.50, more preferably −4.60 to −2.50, and still more preferably −4.60 to −3.00.

The Clog P is a value of the common logarithm log P of a partition coefficient P to 1-octanol and water obtained by calculation. The Clog P serves as a hydrophilic indicator. Unless otherwise specified, the Clog P in the present specification is a value calculated using ChemDraw Professional (Version: 16.0.1.4 (77), manufactured by PerkinElmer Inc.).

The specific compound may be used alone or in combination of two or more kinds thereof.

A content of the specific compound is usually 0.01% to 20.0% by mass with respect to the total mass of the treatment liquid, preferably 0.1% to 10.0% by mass, more preferably 1.0% to 10.0% by mass, still more preferably 2.5% to 10.0% by mass, and particularly preferably 4.0% to 10.0% by mass.

The content of the specific compound is usually 1.0% to 98.0% by mass with respect to the total mass of components in the treatment liquid excluding a solvent, preferably 5.0% to 95.0% by mass, more preferably 50.0% to 95.0% by mass, still more preferably 70.0% to 95.0% by mass, and particularly preferably 60.0% to 95.0% by mass.

[Sulfur-Containing Compound]

The treatment liquid contains the sulfur-containing compound.

The sulfur-containing compound is a compound having one or more sulfur atoms in the molecule.

In addition, the sulfur-containing compound is preferably a compound different from the above-described compound.

Examples of a functional group included in the sulfur-containing compound include a thiol group, a sulfo group, a sulfonyl group, thioketone (—SO—), and sulfide (—S—).

In addition, the sulfur-containing compound may be a high-molecular-weight compound (polymer).

The sulfur-containing compound preferably includes at least one selected from the group consisting of a thiol compound and a salt thereof, a thioether compound, a thioketone compound, a thiourea compound, a disulfide compound, a polysulfide compound (compound having three or more sulfide bonds), and a sulfur-containing heterocyclic compound; more preferably includes at least one selected from the group consisting of a thiol compound and a salt thereof, a thiourea compound, and a disulfide compound; and still more preferably includes at least one selected from a thiol compound and a salt thereof, and a thiourea compound.

Examples of the thiol compound include cysteine, cysteamine, N-acetylcysteine, thioglycerol, mercaptopropionic acid, mercaptosuccinic acid, meso-2,3-dimercaptosuccinic acid, and mercaptotriazole.

Examples of the above-described salt include a compound in which $H^+$ (proton) in an $S^-H^+$ group of the thiol compound is replaced with another cation, and examples thereof include an alkali metal salt such as a sodium salt and a potassium salt, and an ammonium salt.

Examples of the thioether compound include diethyl sulfide, diphenyl sulfide, and penicillin.

Examples of the thioketone compound include 2-cyanothioacetamide and thiobenzamide.

Examples of the thiourea compound include thiourea, tetramethylthiourea, imidazolidinethione, 3,4,5,6-tetrahydropyrimidine-2-thiol, and 4-methyl-3-thiosemicarbazide.

Examples of the disulfide compound include cystine and N,N'-diacetylcystine.

Examples of the polysulfide compound include dimethyltrisulfide and dipropyltrisulfide.

The sulfur-containing heterocyclic compound is a compound having a heterocyclic ring including a sulfur atom as a ring member atom.

Examples of the sulfur-containing heterocyclic compound include 2-amino-1,3,4-thiadiazole, thiazine, benzothiazine, and benzothiazole.

Examples of the sulfur-containing compound also include sulfur-containing compounds other than those described above.

Examples of other sulfur-containing compounds include a sulfonyl compound (compound having a sulfonyl group).

Examples of the sulfonyl compound include sulbactam and diaphenyl sulfone.

The sulfur-containing compound preferably includes at least one selected from the group consisting of cysteine, cysteamine, N-acetylcysteine, thioglycerol, mercaptopropionic acid, mercaptosuccinic acid, meso-2,3-dimercaptosuccinic acid, mercaptotriazole, and tetramethylthiourea; more preferably includes cysteine or tetramethylthiourea; and still more preferably includes cysteine.

In addition, it is also preferable that the sulfur-containing compound includes at least one selected from the group consisting of penicillin, sulbactam, and diaphenyl sulfone. In a case of including the above-described compound, an antibacterial action is excellent.

A molecular weight of the sulfur-containing compound is preferably 75 to 325, more preferably 100 to 200, and still more preferably 120 to 150.

A Clog P of the sulfur-containing compound is preferably −4.50 to 1.00, more preferably −3.50 to 0.60, and still more preferably −2.50 to −2.00.

The sulfur-containing compound may be used alone or in combination of two or more kinds thereof, and from the viewpoint of improving the removability of the hydrophobic anticorrosion agent, it is preferable to use two kinds thereof.

A content of the sulfur-containing compound is preferably 0.0001% to 20.0% by mass, more preferably 0.01% to 5.0% by mass, and still more preferably 0.8% to 1.5% by mass with respect to the total mass of the treatment liquid.

The content of the sulfur-containing compound is preferably 0.0001% to 20.0% by mass, more preferably 0.01% to 5.0% by mass, and still more preferably 0.8% to 1.5% by mass with respect to the total mass of components in the treatment liquid excluding a solvent.

[Solvent]

The treatment liquid contains a solvent.

Examples of the solvent include water and an organic solvent, and water is preferable.

Examples of the water include distilled water, deionized water, and pure water (ultrapure water). As the above-described water, pure water (ultrapure water) is preferable from the viewpoint that it includes almost no impurities and has less influence on a semiconductor substrate in a step of manufacturing the semiconductor substrate.

A content of the water is not particularly limited as long as it is a remainder of components which can be contained in the treatment liquid.

The content of the water is preferably 1.0% by mass or more, more preferably 30.0% by mass or more, still more preferably 50.0% by mass or more, and particularly preferably 60.0% by mass or more with respect to the total mass of the treatment liquid. The upper limit thereof is preferably 99.99% by mass or less, more preferably 99.9% by mass or less, and still more preferably 99.0% by mass or less with respect to the total mass of the treatment liquid.

Examples of the organic solvent include known organic solvents, and a hydrophilic organic solvent such as an alcohol and a ketone is preferable.

Examples of the organic solvent include organic solvents described in paragraphs to of JP2021-052186A, the content of which is incorporated herein by reference.

[Compound X]

The treatment liquid may contain a compound X.

In a case where the treatment liquid contains the compound X, the removability of the hydrophobic anticorrosion agent is improved.

The compound X is at least one compound selected from the group consisting of a glycol compound, a monoalkyl ether compound, and an alkylene oxide compound.

The glycol compound is a compound having two hydroxy groups in the molecule.

The monoalkyl ether compound is a compound having one hydroxy group and one or more —OR (R represents an organic group) in the molecule.

The alkylene oxide compound is a compound having no hydroxy group and having one or more alkyleneoxy groups (preferably, an ethyleneoxy group) in the molecule.

Examples of the glycol compound include diethylene glycol, triethylene glycol, tetraethylene glycol, polyethylene glycol, dipropylene glycol, tripropylene glycol, ethylene glycol, propylene glycol, 1,3-propanediol, 1,2-butanediol, 1,3-butanediol, 1, 4-butanediol, 1,2-pentanediol, 1,5-pentanediol, 1,2-hexanediol, 1,6-hexanediol, 1,2-heptanediol, 2,2-dimethyl-1,3-propanediol, 2-methyl-1,3-propanediol, 2-ethyl-2-methyl-1,3-propanediol, 3-methyl-1,3-butanediol, 3-methyl-1,5-pentanediol, 2-methyl-2-propyl-1,3-propanediol, 2-methylpentane-2,4-diol, and 2-ethyl-1,3-hexanediol.

Examples of the monoalkyl ether compound include 2-butoxyethanol, ethylene glycol monohexyl ether, diethylene glycol monomethyl ether, diethylene glycol monoethyl ether, diethylene glycol monopropyl ether, diethylene glycol monobutyl ether, diethylene glycol monohexyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monobutyl ether, propylene glycol monomethyl ether, propylene glycol monoethyl ether, propylene glycol monopropyl ether, propylene glycol monobutyl ether, propylene glycol monohexyl ether, dipropylene glycol monomethyl ether, dipropylene glycol monoethyl ether, dipropylene glycol monopropyl ether, dipropylene glycol monobutyl ether, tripropylene glycol monomethyl ether, and tripropylene glycol monobutyl ether.

Examples of the alkylene oxide compound include compounds in which all hydroxy groups in the above-described glycol compound and the above-described monoalkyl ether compound are substituted with organic groups.

Specific examples thereof include diethylene glycol dibutyl ether, diethylene glycol butyl methyl ether, diethylene glycol dipropyl ether, triethylene glycol diethyl ether, tetraethylene glycol dimethyl ether, tetraethylene glycol diethyl ether, ethylene glycol dimethyl ether, diethylene glycol dimethyl ether, and triethylene glycol dimethyl ether.

The compound X preferably includes at least one selected from the group consisting of the glycol compound and the monoalkyl ether compound; more preferably includes at least one selected from the group consisting of ethylene glycol, propylene glycol, 1,3-butanediol, and 2-butoxyethanol; and still more preferably includes propylene glycol.

The compound X may be used alone or in combination of two or more kinds thereof, and from the viewpoint of improving the removability of the hydrophobic anticorrosion agent, it is preferable to use two kinds thereof.

A content of the compound X is usually 0.0001% to 20.0% by mass with respect to the total mass of the treatment liquid, preferably 0.01% to 5.0% by mass, more preferably 0.5% to 5.0% by mass, and still more preferably 1.0% to 1.5% by mass.

The content of the compound X is usually 0.01% to 80.0% by mass with respect to the total mass of components in the treatment liquid excluding a solvent, preferably 0.1% to 50.0% by mass, more preferably 5.0% to 50.0% by mass, and still more preferably 10.0% to 20.0% by mass.

[Amine Compound]

The treatment liquid may contain an amine compound.

The specific compound and the sulfur-containing compound described above are not included in the amine compound. In addition, it is also preferable that the amine compound is different from an anticorrosion agent described later.

The amine compound is a compound which has an amino group. The amino group included in the above-described amine compound is at least one selected from the group consisting of a primary amino group ($—NH_2$), a secondary amino group (>NH), and a tertiary amino group (>N—). In a case where the amine compound has a plurality of classes of amino groups, the amine compound is classified into an amine compound having the highest amino group. Specifically, an amine compound having a primary amino group and a secondary amine group is an amine compound having a secondary amine group.

Examples of the amine compound include an aliphatic amine, an amino alcohol, and a guanidine compound. The above-described amine compound may be chain-like (linear or branched) or cyclic.

<Aliphatic Amine>

Examples of the aliphatic amine include a primary aliphatic amine (aliphatic amine having a primary amino group), a secondary aliphatic amine (aliphatic amine having a secondary amino group), and a tertiary aliphatic amine (aliphatic amine having a tertiary aliphatic amine).

Examples of the primary chain-like aliphatic amine include methylamine, ethylamine, propylamine, dimethyl-amine, diethylamine, n-butylamine, 3-methoxypropylamine, tert-butylamine, n-hexylamine, n-octylamine, and 2-ethylhexylamine.

Examples of the primary cyclic aliphatic amine include cyclohexylamine.

Examples of the secondary chain-like aliphatic amine include alkylenediamines such as ethylenediamine (EDA), 1,3-propanediamine (PDA), 1,2-propanediamine, 1,3-butanediamine, and 1,4-butanediamine, and polyalkylpolyamines such as diethylenetriamine (DETA), triethylenetetramine (TETA), bis(aminopropyl)ethylenediamine (BAPEDA), and tetraethylenepentamine.

Examples of the secondary cyclic aliphatic amine include piperazine, 2-methylpiperazine, 2,5-dimethylpiperazine, and 2,6-dimethylpiperazine.

Examples of the tertiary aliphatic amine include a tertiary aliphatic amine which has a tertiary amino group in the molecule and does not have an aromatic ring group.

Examples of the tertiary chain-like aliphatic amine include tertiary alkyl amines such as trimethylamine and triethylamine, alkylene amines such as 1,3-bis(dimethylamino)butane, and polyalkylpolyamines such as N,N,N',N",N"-pentamethyldiethylenetriamine.

Examples of the tertiary cyclic aliphatic amine include a tertiary aliphatic amine having a nitrogen atom as a ring member atom and having a non-aromatic heterocyclic ring.

Examples of the tertiary cyclic aliphatic amine a cyclic amidine compound and a piperazine compound.

(Cyclic Amidine Compound)

The cyclic amidine compound is a compound having a heterocyclic ring including an amidine structure (>N—C═N—) in the ring.

The number of ring members in the above-described heterocyclic ring included in the cyclic amidine compound is preferably 5 or 6 and more preferably 6.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimid[1.2-a]azocine, 3,4,6,7,8,9-hexahydro-2H-pyrido[1.2-a]pyrimidine, 2,5,6,7-tetrahydro-3H-pyrrolo[1.2-a]imidazole, 3-ethyl-2,3,4,6,7,8,9,10-octahydropyrimid[1.2-a]azepine, and creatinine; and DBU or DBN is preferable.

(Piperazine Compound)

The piperazine compound is a compound having a hetero-6-membered ring (a piperazine ring) in which an opposite —CH— group of a cyclohexane ring is replaced with a tertiary amino group (>N—).

Examples of the piperazine compound include 1-methylpiperazine, 1-ethylpiperazine, 1-propylpiperazine, 1-butylpiperazine, 1,4-dimethylpiperazine, 1-phenylpiperazine, N-(2-aminoethyl)piperazine (AEP), 1,4-bis(2-aminoethyl)piperazine (BAEP), 1,4-bis(3-aminopropyl)piperazine (BAPP), and 1,4-diazabicyclo[2.2.2]octane (DABCO); and DABCO is preferable.

Examples of the tertiary cyclic aliphatic amine also include a compound having a non-aromatic hetero-5-membered ring such as 1,3-dimethyl-2-imidazolidinone, and an aromatic compound having a 7-membered ring including a nitrogen atom.

<Amino Alcohol>

The amino alcohol is a compound having one or more amino groups and one or more hydroxy groups.

Examples of the primary amino alcohol include monoethanolamine (MEA), 2-amino-2-methyl-1-propanol (AMP), 3-amino-1-propanol, 1-amino-2-propanol, hydroxymethylaminomethane, diethylene glycolamine (DEGA), and 2-(aminoethoxy)ethanol (AEE).

Examples of the secondary amino alcohol include uracil, N-methylethanolamine, 2-(ethylamino)ethanol, 2-[(hydroxymethyl)amino]ethanol, 2-(propylamino)ethanol, N,N'-bis(2-hydroxyethyl)ethylenediamine, diethanolamine, 2-(2-aminoethylamino)ethanol (AAE), N-butyl ethanolamine, and N-cyclohexylethanolamine.

Examples of the tertiary amino alcohol include N-methyldiethanolamine (MDEA), 2-(dimethylamino)ethanol (DMAE), N-ethyldiethanolamine (EDEA), 2-diethylaminoethanol, 2-(dibutylamino)ethanol, 2-[2-(dimethylamino)ethoxy] ethanol, 2-[2-(diethylamino)ethoxy] ethanol, triethanolamine, N-butyldiethanolamine (BDEA), N-tert-butyldiethanolamine (t-BDEA), 1-[bis(2-hydroxyethyl)amino]-2-propanol (Bis-HEAP), 1-(2-hydroxyethyl)piperazine (HEP), 1,4-bis(2-hydroxyethyl)piperazine (BHEP), 2-(N-ethylanilino)ethanol, N-phenyldiethanolamine (Ph-DEA), N-benzyldiethanolamine, p-tolyldiethanolamine, m-tolyldiethanolamine, 2-(dimethylamino)-1,3-propanediol, 2-[[2-(dimethylamino)ethyl]methylamino]ethanol, and stearyl diethanolamine; and MDEA, DMAE, EDEA, or 2-diethylamino ethanol is preferable and MDEA is more preferable.

<Guanidine Compound>

The guanidine compound is a compound having $NR_2$—C(═NR)—$NR_2$. R represents a hydrogen atom or a substituent.

Examples of the guanidine compound include guanidine, tetramethylguanidine, arginine, and chlorohexidine.

The amine compound preferably includes the amino alcohol; more preferably includes at least one selected from the group consisting of monoethanolamine and N-methyldiethanolamine; and still more preferably includes monoethanolamine.

The amine compound may be used alone or may be used in combination of two or more kinds thereof.

A content of the amine compound is usually 0.0001% to 20.0% by mass with respect to the total mass of the treatment liquid, preferably 0.01% to 5.0% by mass, more preferably 0.5% to 1.5% by mass, and still more preferably 1.0% to 1.5% by mass.

The content of the amine compound is usually 0.01% to 80.0% by mass with respect to the total mass of components in the treatment liquid excluding a solvent, preferably 0.1% to 50.0% by mass, more preferably 5.0% to 20.0% by mass, and still more preferably 10.0% to 20.0% by mass.

[Anticorrosion Agent]

The treatment liquid may contain an anticorrosion agent.

The anticorrosion agent is preferably a nitrogen-containing heterocyclic compound, more preferably a purine compound or an azole compound, and still more preferably a purine compound.

The nitrogen-containing heterocyclic compound is a compound having a heterocyclic ring including a nitrogen atom as a ring member atom.

The anticorrosion agent is preferably a compound different from the above-described compounds which can be contained in the treatment liquid.

<Purine Compound>

The purine compound is at least one compound selected from the group consisting of purine and a purine derivative. In a case where the treatment liquid contains the purine compound, the treatment liquid has excellent anticorrosion properties and excellent residue removability.

Examples of the purine compound include purine, adenine, guanine, hypoxanthine, xanthine, theobromine, caffeine, uric acid, isoguanine, adenosine, enprofylline, theophylline, xanthosine, 7-methylxanthosine, 7-methylxanthine, theophylline, eritadenine, 3-methyladenine, 3-methylxanthine, 1,7-dimethylxanthine, 1-methylxanthine, paraxanthine, 1,3-dipropyl-7-methylxanthine, 3, 7-dihydro-7-methyl-1H-purine-2, 6-dione, 1, 7-dipropyl-3-methylxanthine, 1-methyl-3, 7-dipropylxanthine, 1,3-dipropyl-7-methyl-8-dicyclopropylmethylxanthine, 1,3-dibutyl-7-(2-oxopropyl)xanthine, 1-butyl-3, 7-dimethylxanthine, 3,7-dim ethyl-1-propylxanthine, 2-aminopurine, 6-aminopurine, 6-benzylaminopurine, nelarabine, vidarabine, 2,6-dichloropurine, aciclovir, $N^6$-benzoyl adenosine, trans-zeatin, 6-benzyl aminopurine, entecavir, valaciclovir, abacavir, 2'-deoxyguanosine, disodium inosinate, ganciclovir, guanosine 5'-disodium monophosphate, O-cyclohexylmethylguanine, $N^2$-isobutyryl-2'-deoxyguanosine, β-nicotinamide adenine dinucleotide phosphate, 6-chloro-9-(tetrahydropyran-2-yl) purine, clofarabine, kinetin, 7-(2,3-dihydroxypropyl) theophylline, proxyphylline, 2,6-diaminopurine, 2',3'-dideoxyinosine, theophylline-7-acetic acid, 2-chloroadenine, 2-amino-6-chloropurine, 8-bromo-3-methylxanthine, 2-fluoroadenine, penciclovir, 9-(2-hydroxyethyl)adenine, 7-(2-chloroethyl) theophylline, 2-amino-6-iodopurine, 2-amino-6-methoxypurine, N-acetylguanine, adefovir dipivoxil, 8-chlorotheophylline, 6-methoxypurine, 1-(3-chloropropyl) theobromine, 6-(dimethylamino)purine, and inosine.

The purine compound preferably includes at least one selected from the group consisting of purine, adenine, guanine, hypoxanthine, xanthine, theobromine, caffeine, uric acid, isoguanine, adenosine, enprophylline, theophylline, xanthosine, 7-methylxanthosine, 7-methylxanthine, theophylline, eritadenine, 3-methyladenine, 3-methylxanthine, 1,7-dimethylxanthine, 1-methylxanthine, and paraxanthine; more preferably includes at least one selected from the group consisting of adenine, guanine, and xanthine; and still more preferably includes xanthine.

<Azole Compound>

The azole compound is a compound having a hetero-5-membered ring including one or more nitrogen atoms and having aromaticity.

The number of nitrogen atoms included in the hetero-5-membered ring of the azole compound is preferably 1 to 4 and more preferably 1 to 3.

The azole compound may have a substituent on the hetero-5-membered ring.

Examples of the substituent include a hydroxy group, a carboxy group, an amino group, an alkyl group having 1 to 4 carbon atoms, which may have an amino group, and a 2-imidazolyl group.

Examples of the azole compound include an imidazole compound in which one of the atoms constituting an azole ring is a nitrogen atom, a pyrazole compound in which two of the atoms constituting an azole ring are nitrogen atoms, a thiazole compound in which one of the atoms constituting an azole ring is a nitrogen atom and the other is a sulfur atom, a triazole compound in which three of the atoms constituting an azole ring are nitrogen atoms, and a tetrazole compound in which four of the atoms constituting an azole ring are nitrogen atoms.

Examples of the imidazole compound include imidazole, 1-methylimidazole, 2-methylimidazole, 5-methylimidazole, 1,2-dimethylimidazole, 4-hydroxyimidazole, 2,2'-biimidazole, 4-imidazolecarboxylic acid, histamine, and benzimidazole.

Examples of the pyrazole compound include pyrazole, 4-pyrazolecarboxylic acid, 1-methyl pyrazol e, 3-methyl pyrazol e, 3-amino-5-methyl pyrazol e, 3-amino-5-hydroxypyrazol e, 3-aminopyrazole, and 4-aminopyrazole.

Examples of the thiazole compound include 2,4-dimethylthiazole and benzothiazole.

Examples of the triazole compound include 1,2,4-triazole, 3-methyl-1,2,4-triazole, 3-amino-1,2,4-triazole, 1,2,3-triazole, 1-methyl-1,2,3-triazole, benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole, and 2,2'-{[(5-methyl-1H-benzotriazole-1-yl)methyl]imino} diethanol; and 1,2,4-triazole is preferable.

Examples of the tetrazole compound include 1H-tetrazole (1,2,3,4-tetrazole), 5-methyl-1,2,3,4-tetrazole, 5-amino-1,2,3,4-tetrazole, and 1,5-pentamethylenetetrazole.

The azole compound is preferably a triazole compound and more preferably 1,2,4-triazole.

The anticorrosion agent may be used alone or in combination of two or more kinds thereof.

A content of the anticorrosion agent is preferably 0.0001% to 10.0% by mass, more preferably 0.001% to 5.0% by mass, and still more preferably 0.01% to 1.0% by mass with respect to the total mass of the treatment liquid.

The content of the anticorrosion agent is preferably 0.01% to 80.0% by mass, more preferably 0.1% to 50.0% by mass, and still more preferably 1.0% to 10.0% by mass with respect to the total mass of components in the treatment liquid excluding a solvent.

[Chelating Agent]

The treatment liquid may contain a chelating agent.

The specific compound and the sulfur-containing compound described above are not included in the chelating agent.

In a case where the treatment liquid contains the chelating agent, the removability of the hydrophobic anticorrosion agent is improved.

Examples of the chelating agent include an organic acid and a salt thereof. Examples of the above-described salt include an alkali metal salt such as a sodium salt and a potassium salt, and an ammonium salt.

<Organic Acid>

Examples of the organic acid include a carboxylic acid-based organic acid, a phosphonic acid-based organic acid, and a salt thereof, and a carboxylic acid-based organic acid is preferable and dicarboxylic acid is more preferable.

Examples of an acid group included in the organic acid include a carboxy group, a phosphonate group, and a phenolic hydroxy group.

The organic acid preferably has at least one selected from the group consisting of a carboxy group and a phosphonate group, and more preferably has a carboxy group.

A molecular weight of the organic acid is preferably 600 or less, more preferably 450 or less, and still more preferably 300 or less. The lower limit thereof is preferably 50 or more and more preferably 100 or more.

The number of carbon atoms in the organic acid is preferably 1 to 15 and more preferably 2 to 15.

The carboxylic acid-based organic acid is a compound having one or more carboxy groups.

Examples of the carboxylic acid-based organic acid include an aliphatic carboxylic acid-based organic acid, an amino polycarboxylic acid-based organic acid, and an amino acid-based organic acid, and an aliphatic carboxylic acid-based organic acid is preferable.

The aliphatic carboxylic acid-based organic acid may further have a hydroxy group in addition to the carboxylic acid group and the aliphatic group.

Examples of the aliphatic carboxylic acid-based organic acid include oxalic acid, malonic acid, succinic acid, glutaric acid, adipic acid, pimelic acid, sebacic acid, maleic acid, malic acid, citric acid, and tartaric acid, and citric acid, succinic acid, or tartaric acid is preferable.

Examples of the amino polycarboxylic acid-based organic acid include compounds described in paragraphs [0067] and [0068] of WO2018/021038A, the content of which is incorporated herein by reference.

Examples of the amino acid-based organic acid include compounds described in paragraphs [0030] to [0033] of JP2020-161511A, compounds described in paragraphs [0021] to [0023] of JP2016-086094A, and histidine derivatives described in JP2015-165561A and JP2015-165562A, the content of which is incorporated herein by reference.

Examples of the phosphonic acid-based organic acid include compounds described in paragraphs [0026] to [0036] of WO2018/020878A and compounds described in paragraphs [0031] to [0046] of WO2018/030006A, the content of which is incorporated herein by reference.

The chelating agent may be used alone or in combination of two or more kinds thereof.

A content of the chelating agent is preferably 0.0001% to 20.0% by mass, more preferably 0.01% to 5.0% by mass, and still more preferably 1.0% to 1.5% by mass with respect to the total mass of the treatment liquid.

The content of the chelating agent is preferably 0.01% to 80.0% by mass, more preferably 0.1% to 50.0% by mass, and still more preferably 10.0% to 20.0% by mass with respect to the total mass of components in the treatment liquid excluding a solvent.

[Inorganic Acid]

The treatment liquid may contain an inorganic acid.

The specific compound and the sulfur-containing compound described above are not included in the inorganic acid.

From the viewpoint of excellent removability of the hydrophobic anticorrosion agent, the treatment liquid preferably contains at least one selected from the group consisting of the chelating agent and the inorganic acid.

Examples of the inorganic acid include hydrochloric acid, nitric acid, nitrous acid, phosphoric acid, boric acid, hexafluorophosphoric acid, ammonium halides, and salts thereof. Examples of the above-described salt include an alkali metal salt such as a sodium salt and a potassium salt, and an ammonium salt.

The inorganic acid may be used alone or in combination of two or more kinds thereof.

A content of the inorganic acid is preferably 0.0001% to 20.0% by mass, more preferably 0.01% to 5.0% by mass, and still more preferably 1.0% to 1.5% by mass with respect to the total mass of the treatment liquid.

The content of the inorganic acid is preferably 0.01% to 80.0% by mass, more preferably 0.1% to 50.0% by mass, and still more preferably 10.0% to 20.0% by mass with respect to the total mass of components in the treatment liquid excluding a solvent.

[Surfactant]

The treatment liquid may contain a surfactant.

The surfactant is a compound having a hydrophilic group and a hydrophobic group (lipophilic group) in one molecule, and examples thereof include a nonionic surfactant, an anionic surfactant, a cationic surfactant, and an amphoteric surfactant.

In a case where the treatment liquid contains the surfactant, metal corrosion prevention property and removability of polishing fine particles are more excellent.

In a large number of cases, the surfactant has at least one hydrophobic group selected from the group consisting of an aliphatic hydrocarbon group, an aromatic hydrocarbon group, and a group obtained by combining these groups.

In a case where the hydrophobic group includes an aromatic hydrocarbon group, the number of carbon atoms in the aromatic hydrocarbon group is preferably 6 or more and more preferably 10 or more. The upper limit thereof is preferably 20 or less and more preferably 18 or less.

In a case where the hydrophobic group does not include an aromatic hydrocarbon group and consists of only aliphatic hydrocarbon group, the number of carbon atoms in the aliphatic hydrocarbon group is preferably 9 or more, more preferably 13 or more, and still more preferably 16 or more. The upper limit thereof is preferably 20 or less and more preferably 18 or less.

The number of carbon atoms in the surfactant is preferably 16 to 100.

Examples of the nonionic surfactant include an ester-type nonionic surfactant, an ether-type nonionic surfactant, an ester-ether-type nonionic surfactant, and an alkanolamine-type nonionic surfactant, and an ether-type nonionic surfactant is preferable.

Examples of the nonionic surfactant include alkyl polyglucoside, octylphenol ethoxylate, nonylphenol ethoxylate (Tergitol NP-12, Triton (registered trademark) X-15, X-45, X-100, X-102, X-114, BG-10, CG-110, and CG-119, and the like manufactured by Dow Chemical), silane polyalkylene oxide (copolymer) (Y-17112-SGS, manufactured by Momentive Performance Materials), Silwet (registered trademark) HS-312 (manufactured by Momentive Performance Materials), tristyrylphenol ethoxylate (MAKON TSP-20, manufactured by Stepan), polyoxyethylene alkyl ether, polyoxyethylene alkylphenyl ether, alkylallylformaldehyde-condensed polyoxyethylene ether, polyoxyethylene polyoxypropylene block polymer, polyoxyethylene polyoxypropylene alkyl ether, polyoxyethylene ethers of glycerin ester, polyoxyethylene ether of sobitan ester, polyoxyethylene ether of sorbitol ester, polyethylene glycol fatty acid ester, glycerin ester, polyglycerin ester, sorbitan ester, propylene glycol ester, sucrose ester, fatty acid alkanolamide, polyoxyethylene fatty acid amide, polyoxyethylene alkylamide, alcohol ethoxylates [BRIJ (registered trademark) series, 35 ($C_{12}H_{25}(OCH_2CH_2)_{23}OH$), 56 ($C_{16}H_{33}(OCH_2CH_2)_{10}OH$), 58 ($C_{16}H_{33}(OCH_2CH_2)_{20}OH$), and the like], primary and secondary alcohol ethoxylates, amine ethoxylate, glucoside, glucamide, poly(ethylene glycol-co-propylene glycol), cetyl alcohol, stearyl alcohol, cetostearyl alcohol, oleyl alcohol, octaethylene glycol monododecyl ether, pentaethylene glycol monododecyl ether, polyoxypropylene glycol alkyl ether, decyl glucoside, lauryl glucoside, octyl glucoside, polyoxyethylene glycol octylphenol ether, nonoxynol-9, glycerol alkyl ester, glyceryl laurate, polyoxyethylene glycol sorbitan alkyl ester, polysorbate, sorbitan alkyl ester, spun, cocamide MEA, cocamide DEA, dodecyldimethylamine oxide, block copolymer of polypropylene glycol, and mixtures thereof.

Examples of the anionic surfactant include a phosphoric acid ester-based surfactant having a phosphoric acid ester group, a phosphonic acid-based surfactant having a phosphonate group, and a carboxylic acid-based surfactant having a carboxy group.

Examples of the anionic surfactant include carboxylate salts such as decanecarboxylic acid, N-acylamino acid salt, and polyoxyethylene or polyoxypropylene alkyl ether carboxylate; acylated peptides; phosphate ester salts; alkyl phosphates; polyoxyethylene or polyoxypropylene alkyl allyl ether phosphates; alkyl aryl ether phosphates; sodium lauroyl sarcosinate; perfluorononanoate; perfluorooctanoate; and mixtures thereof.

Examples of the cationic surfactant include a quaternary ammonium salt-based surfactant and an alkyl pyridium-based surfactant.

Examples of the cationic surfactant include cetylpyridinium chloride (CPC), polyethoxylated tallow amine (POEA), benzalkonium chloride (BAC), benzethonium chloride (BZT), 5-bromo-5-nitro-1,3-dioxane, aliphatic amine salts, benzalkonium chloride salts, benzethonium chloride, pyridinium salts, and imidazolinium salts.

Examples of the amphoteric surfactant include a carboxybetaine-type amphoteric surfactant, amino carboxylate, imidazolinium betaine, lecithin, alkylamine oxide, and mixtures thereof.

Examples of the surfactant also include compounds described in paragraphs [0092] to [0096] of JP2015-158662A, paragraphs and of JP2012-151273A, and paragraphs [0014] to [0020] of JP2009-147389A, the content of which is incorporated herein by reference.

The surfactant may be used alone or in combination of two or more kinds thereof.

A content of the surfactant is preferably 0.00001% to 1.0% by mass, more preferably 0.0001% to 0.1% by mass, and still more preferably 0.001% to 0.01% by mass with respect to the total mass of the treatment liquid.

The content of the surfactant is preferably 0.000001% to 50.0% by mass, more preferably 0.00001% to 20.0% by mass, and still more preferably 0.0001% to 10.0% by mass with respect to the total mass of components in the treatment liquid excluding a solvent.

[pH Adjusting Agent]

The treatment liquid may contain a pH adjusting agent.

Examples of the pH adjusting agent include a basic compound and an acidic compound.

In addition, a pH of the treatment liquid may be adjusted by adjusting an adding amount of each of the above-described components which can be contained in the treatment liquid.

Examples of the pH adjusting agent include paragraphs and of WO2019-151141A and paragraph of WO2019-151001A, the content of which is incorporated herein by reference.

The pH adjusting agent may be used alone or in combination of two or more kinds thereof.

A content of the pH adjusting agent is not particularly limited as long as the amount reaches an intended pH.

The content of the pH adjusting agent is preferably 0.0001% to 5.0% by mass, more preferably 0.01% to 2.0% by mass, and still more preferably 0.1% to 1.0% by mass with respect to the total mass of the treatment liquid.

The content of the pH adjusting agent is preferably 0.001% to 30% by mass, more preferably 0.01% to 10.0% by mass, and still more preferably 0.1% to 5.0% by mass with respect to the total mass of components in the treatment liquid excluding a solvent.

[Other Components]

The treatment liquid may contain other components in addition to the above-described components which can be contained in the treatment liquid.

Examples of the other components include a polymer, an oxidant, a polyhydroxy compound having a molecular weight of 500 or more, a fluorine compound, and an antibacterial agent.

The other components preferably include at least one selected from the group consisting of a polymer and an antibacterial agent.

The other components may be used alone or in combination of two or more kinds thereof.

The polymer is preferably a water-soluble polymer.

The "water-soluble polymer" means a compound having two or more constitutional units linked in a linear or mesh form through a covalent bond, in which a mass of the polymer dissolved in 100 g of water at 20° C. is 0.1 g or more.

Examples of the water-soluble polymer include a polyacrylic acid, a polymethacrylic acid, a polymaleic acid, a polyvinylsulfonic acid, and salts thereof; copolymers of monomers such as styrene, α-methylstyrene, and/or 4-methylstyrene and acid monomers such as a (meth)acrylic acid and/or a maleic acid, and salts thereof; polyglycerin; vinyl-based synthetic polymers such as polyvinyl alcohol, polyoxyethylene, polyvinylpyrrolidone, polyvinylpyridine, polyacrylamide, polyvinyl formamide, polyethyleneimine, polyvinyloxazoline, polyvinylimidazole, and polyallylamine; and modified products of natural polysaccharides such as hydroxyethyl cellulose, carboxymethyl cellulose, and processed starch.

The water-soluble polymer may be any of a polymer obtained by polymerizing one kind of monomer or a copolymer obtained by copolymerizing two or more kinds of monomers.

Examples of the monomer include monomers selected from the group consisting of a monomer having a carboxy group, a monomer having a hydroxy group, a monomer having a polyethylene oxide chain, a monomer having an amino group, and a monomer having a heterocyclic ring.

It is also preferable that the water-soluble polymer is a polymer consisting of only structural units derived from the monomers selected from the above-described group. As the "polymer is composed of substantially only structural units derived from the monomers selected from the above-described group", a content of the structural units derived from the monomers selected from the above-described group is preferably 95% to 100% by mass and more preferably 99% to 100% by mass with respect to the total mass of the polymer.

Examples of the polymer also include water-soluble polymers described in paragraphs [0043] to [0047] of JP2016-171294A, the content of which is incorporated herein by reference.

A molecular weight (in a case of having a molecular weight distribution, a weight-average molecular weight) of the polymer is preferably 300 or more, more preferably more than 600, still more preferably 2,000 or more, and particularly preferably 10,000 or more. The upper limit thereof is preferably 1,500,000 or less and more preferably 1,000,000 or less.

In a case where the polymer is the water-soluble polymer, a weight-average molecular weight of the water-soluble polymer is preferably 300 or more, more preferably 2,000 or more, and still more preferably 10,000 or more. The upper limit thereof is preferably 1,500,000 or less, more preferably 1,200,000 or less, and still more preferably 1,000,000 or less.

The polymer preferably has a constitutional unit having a carboxy group (a constitutional unit derived from (meth) acrylic acid, or the like). A content of the constitutional unit having a carboxy group is preferably 30% to 100% by mass, more preferably 70% to 100% by mass, and still more preferably 85% to 100% by mass with respect to the total mass of the polymer.

A content of the polymer is preferably 0.00001% to 1% by mass, more preferably 0.0001% to 0.1% by mass, and still more preferably 0.001% to 0.01% by mass with respect to the total mass of the treatment liquid.

The content of the polymer is preferably 0.000001% to 50% by mass, more preferably 0.00001% to 20% by mass, and still more preferably 0.0001% to 10% by mass with respect to the total mass of components in the treatment liquid excluding a solvent. In a case where the content of the polymer is within the above-described range, the polymer is appropriately adsorbed on the surface of the substrate, contributing to the improvement of the metal corrosion prevention performance of the treatment liquid, and the viscosity and/or cleaning performance of the treatment liquid are excellent.

Examples of the oxidant include a peroxide, a percarbonate, acids thereof, and salts thereof. Specific examples thereof include an oxidative halide (for example, a periodic acid such as iodic acid, metaperiodic acid, and orthoperiodic acid, salts thereof, or the like), a perboric acid, a perboric acid salt, a cerium compound, and a ferricyanide (for example, potassium ferricyanide or the like).

A content of the oxidant is preferably 0.0001% to 5.0% by mass, more preferably 0.01% to 2.0% by mass, and still more preferably 0.1% to 1.0% by mass with respect to the total mass of the treatment liquid.

The content of the oxidant is preferably 0.001% to 30.0% by mass, more preferably 0.01% to 10.0% by mass, and still more preferably 0.1% to 5.0% by mass with respect to the total mass of components in the treatment liquid excluding a solvent.

The polyhydroxy compound having a molecular weight of 500 or more is a compound different from the above-described compounds which can be contained in the treatment liquid.

The above-described polyhydroxy compound is an organic compound having two or more (for example, 2 to 200) alcoholic hydroxy groups in one molecule.

A molecular weight (in a case of having a molecular weight distribution, a weight-average molecular weight) of the above-described polyhydroxy compound is 500 or more, preferably 500 to 100,000 and more preferably 500 to 3,000.

Examples of the above-described polyhydroxy compound include oligosaccharides such as manninotriose, cellotriose, gentianose, raffinose, melezitose, cellotetrose, and stachyose; polysaccharides such as starch, glycogen, cellulose, chitin, and chitosan; and hydrolysates thereof.

Cyclodextrin is also preferable as the above-described polyhydroxy compound.

The “cyclodextrin” means one kind of cyclic oligosaccharide having a cyclic structure in which a plurality of D-glucoses are bonded by a glucoside bond. The cyclodextrin is a compound in which 5 or more (for example, 6 to 8) glucoses are bonded.

Examples of the cyclodextrin include α-cyclodextrin, β-cyclodextrin, and γ-cyclodextrin, and γ-cyclodextrin is preferable.

Examples of the fluorine compound include compounds described in paragraphs [0013] to [0015] of JP2005-150236A, the content of which is incorporated herein by reference.

Examples of the antibacterial agent include sorbic acid, benzoic acid, dehydroacetic acid, and fosfomycin.

The content of each of the above-described components in the treatment liquid can be measured according to a known method such as gas chromatography-mass spectrometry (GC-MS), liquid chromatography-mass spectrometry (LC-MS), and ion-exchange chromatography (IC).

[Mass Ratio of Component]

A mass ratio of the specific compound to the sulfur-containing compound (mass of specific compound/mass of sulfur-containing compound) is usually 0.1 or more, preferably 1.0 or more, more preferably more than 1.0, still more preferably 2.5 or more, particularly preferably 5.0 or more, and most preferably 10.0 or more. The upper limit thereof is usually 100.0 or less, preferably 50.0 or less and more preferably 20.0 or less.

A mass ratio of the specific compound to the compound X (mass of specific compound/mass of compound X) is preferably 50.0 or less, more preferably 10.0 or less, and still more preferably 5.0 or less. The lower limit thereof is preferably 1.0 or more.

A mass ratio of the sulfur-containing compound to the compound X (mass of sulfur-containing compound/mass of compound X) is preferably 0.1 to 10.0, more preferably 1.0 to 2.0, and still more preferably 1.0 to 1.5.

A mass ratio of the specific compound to the amine compound (mass of specific compound/mass of amine compound) is preferably 50.0 or less, more preferably 10.0 or less, and still more preferably 5.0 or less. The lower limit is preferably 1.0 or more.

A mass ratio of the sulfur-containing compound to the amine compound (mass of sulfur-containing compound/mass of amine compound) is preferably 1.0 to 10.0, more preferably 1.0 to 2.0, and still more preferably 1.0 to 1.5.

[Physical Properties of Treatment Liquid]

<pH>

A pH of the treatment liquid is preferably 8.0 to 14.0, more preferably 9.0 to 13.8, and still more preferably 10.0 to 13.5.

In a case where the treatment liquid is diluted to be used, a pH of the diluted treatment liquid (for example, 100-fold diluted treatment liquid in terms of mass ratio or volume ratio) is preferably 8.0 to 14.0, more preferably 9.0 to 13.0, and still more preferably 11.0 to 12.0.

The pH of the treatment liquid can be measured by a method based on JIS Z8802-1984 using a known pH meter. A measurement temperature of the pH is 25° C.

Examples of a method of adjusting the pH include a method of adjusting the type and content of each of the components which can be contained in the treatment liquid, and a method of adding the pH adjusting agent described above.

<Content of Metal Impurities>

A content (measured as an ion concentration) of metal impurities (metal elements of Fe, Co, Na, Cu, Mg, Mn, Li, Al, Cr, Ni, Zn, Sn, and Ag) is preferably 5 ppm by mass or less and more preferably 1 ppm by mass or less with respect to the total mass of the treatment liquid. From the viewpoint of applying to the manufacture of state-of-the-art semiconductor elements, the content of the above-described metal impurities is still more preferably 100 ppb by mass or less, particularly preferably less than 10 ppb by mass, and most preferably a detection limit value or less. The lower limit thereof is preferably 0 ppb by mass or more with respect to the total mass of the treatment liquid.

Examples of a method for reducing the metal content include performing a purifying treatment such as distillation and filtration using an ion exchange resin or a filter at a stage of raw materials used in the production of the treatment liquid or a stage after the production of the treatment liquid.

Other examples of the method for reducing the metal content include using a container with less elution of impurities, which will be described later, as a container that accommodates the raw material or the produced treatment liquid. In addition, other examples thereof include, in order to suppress the elution of metal components from a pipe or the like during the production of the treatment liquid, lining an inner wall of the pipe with a fluororesin.

<Inorganic Particles and Organic Particles>

With respect to the total mass of the treatment liquid, the total content of inorganic particles and organic particles is preferably 1.0% by mass or less, more preferably 0.1% by mass or less, still more preferably 0.01% by mass or less, and particularly preferably a detection limit value or less. The lower limit thereof is preferably 0% by mass or more with respect to the total mass of the treatment liquid.

The inorganic particles and the organic particles contained in the treatment liquid correspond to, for example, particles such as organic solids and inorganic solids contained as impurities in raw materials, and particles such as organic solids and inorganic solids brought in as contaminants during the preparation of the treatment liquid, in which those particles are finally present as particles without being dissolved in the treatment liquid.

The content of the inorganic particles and the organic particles present in the treatment liquid can be measured in a liquid phase by using a commercially available measuring device in a light scattering type liquid particle measuring method using a laser as a light source.

Examples of a method for removing the inorganic particles and the organic particles include a purification treatment such as filtering, which will be described later.

[Production of Treatment Liquid]

The treatment liquid can be produced by a known method.

It is preferable that a method for producing the treatment liquid includes a liquid preparation step.

[Liquid Preparation Step]

The liquid preparation step of the treatment liquid is, for example, a step of preparing the treatment liquid by mixing each of the above-described components which can be contained in the treatment liquid.

There is no particular limitation on the order or timing of mixing together the above-described respective components. Examples of the liquid preparation step include a method in which the specific compound, the sulfur-containing compound, and the compound X and the like as necessary are sequentially added to a container containing purified pure water (ultrapure water) and then stirred, and the pH adjuster is added thereto as necessary to prepare a solution. The method of adding the pure water and each of the above-described components to the container may be either batch addition or divided addition.

Examples of a stirring method in the liquid preparation step of the treatment liquid include a method of carrying out stirring using a known stirrer or a known disperser.

Examples of the above-described stirrer include an industrial mixer, a portable stirrer, a mechanical stirrer, and a magnetic stirrer. Examples of the above-described disperser include an industrial disperser, a homogenizer, an ultrasonic disperser, and a beads mill.

A storage temperature of the mixing of each of the above-described components in the liquid preparation step of the treatment liquid, a purification treatment described below, and the produced treatment liquid is preferably 40° C. or lower and more preferably 30° C. or lower. The lower limit thereof is preferably 5° C. or higher and more preferably 10° C. or higher. In a case where the storage temperature is within the above-described temperature range, storage stability of the treatment liquid is excellent.

<Purification Treatment>

It is preferable that at least one of the raw materials of the treatment liquid is subjected to a purification treatment before the liquid preparation step.

A purity of the raw material after the purification treatment is preferably 99% by mass or more and more preferably 99.9% by mass or more. The upper limit thereof is preferably 99.9999% by mass or less.

Examples of the purification treatment include known methods such as a distillation treatment and a filtering treatment described below, for example, an ion exchange resin, a reverse osmosis membrane (RO membrane), and filtration.

The purification treatment may be carried out by combining a plurality of the above-described purification methods. For example, the raw materials are subjected to a primary purification treatment by passing through the RO membrane, and then the obtained raw materials are subjected to a secondary purification treatment by passing through a purification device consisting of a cation-exchange resin, an anion-exchange resin, or a mixed-bed type ion exchange resin. In addition, the purification treatment may be performed a plurality of times.

Examples of a filter used for the filtering include known filters for filtration.

From the viewpoint of being able to remove highly polar contaminants which tend to cause defects, examples of a material of the filter include fluororesins such as polytetrafluoroethylene (PTFE) and tetrafluoroethylene perfluoroalkyl vinyl ether copolymer (PFA), polyamide-based resins such as nylon, and polyolefin resins (including those with a high density and a ultra-high molecular weight) such as polyethylene and polypropylene (PP). Among these, a polyethylene, a polypropylene (including a high-density polypropylene), a fluororesin (including PTFE and PFA), or a polyamide resin (including nylon) is preferable, and a fluororesin is more preferable.

A critical surface tension of the filter is preferably 70 to 95 mN/m and more preferably 75 to 85 mN/m. In a case where the critical surface tension is within the above-described range, it is possible to remove highly polar contaminants which tend to cause defects. The critical surface tension of the filter is a nominal value of a manufacturer.

A pore diameter of the filter is preferably 2 to 20 nm and more preferably 2 to 15 nm. In a case where the pore diameter of the filter is within the above-described range, it is possible to suppress filtration clogging and to remove fine foreign substances such as impurities and aggregates. The pore diameter of the filter is a nominal value of a manufacturer.

The filtering may be carried out once or twice or more.

In a case where the filtering is carried out twice or more, the filters used for the filtering may be the same or different from each other.

A temperature of the filtering is preferably room temperature (25° C.) or lower, more preferably 23° C. or lower, and still more preferably 20° C. or lower. The lower limit thereof is preferably 0° C. or higher, more preferably 5° C. or higher, and still more preferably 10° C. or higher. In a case where the filtering is carried out in the above range, it is possible to remove foreign substances and impurities dissolved in the raw materials.

<Container>

The treatment liquid (including the aspect of diluted treatment liquid described later) can be added in any container to be stored and transported as long as the container is not corroded.

In application for a semiconductor, the container is preferably a container which has a high degree of cleanliness inside the container and in which the elution of impurities from an inner wall of an accommodating portion of the container into the treatment liquid is suppressed.

Examples of the above-described container include a commercially available container for a semiconductor treatment liquid. Specific examples thereof include CLEAN BOTTLE series (manufactured by AICELLO CORPORATION) and PURE BOTTLE (manufactured by KODAMA PLASTICS Co., Ltd.).

In addition, the container is preferably a container in which a liquid contact portion with the treatment liquid, such as the inner wall of the accommodating portion of the container, is made of a fluororesin (perfluororesin) or metal subjected to an antirust treatment and a metal elution prevention treatment.

The inner wall of the container is preferably formed from at least one resin selected from the group consisting of a polyethylene resin, a polypropylene resin, and a polyethylene-polypropylene resin; another resin different from these resins; or a metal which has been subjected to an antirust treatment and a metal elution prevention treatment, such as stainless steel, Hastelloy, Inconel, and Monel.

The above-described different resin is preferably a fluororesin (perfluororesin).

With a container having an inner wall formed of a fluororesin is used, elution of ethylene and propylene oligomers can be further suppressed than in a case of a container having an inner wall formed of a polyethylene resin, a polypropylene resin, or a polyethylene-polypropylene resin.

Examples of the container having an inner wall formed of a fluororesin include a FluoroPure PFA composite drum (manufactured by Entegris, Inc.) and containers described JP1991-502677A (JP-H3-502677A), WO2004/016526A, and WO99/46309A.

In addition, other than the above-described fluororesin, it is also preferable that the inner wall of the container is made of quartz or a metal material finished up with electropolishing (electropolished metal material).

As a metal material used for producing the electropolished metal material, a metal material containing at least one selected from the group consisting of chromium and nickel, in which the total content of chromium and nickel is more than 25% by mass with respect to the total mass of the metal material, is preferable. Examples thereof include stainless steel and a nickel-chromium alloy.

The total content of chromium and nickel in the metal material is more preferably 30% by mass or more with respect to the total mass of the metal material. The upper limit thereof is preferably 90% by mass or less with respect to the total mass of the metal material.

Examples of a method of electropolishing the metal material include known methods, and specific examples thereof include methods described in paragraphs [0011] to [0014] of JP2015-227501A and paragraphs [0036] to [0042] of JP2008-264929A.

It is preferable that the inside of the container is cleaned before the container is filled with the treatment liquid.

Examples of the cleaning method include known methods. With regard to a liquid used for the cleaning, it is preferable that the amount of metal impurities in the liquid is reduced. The treatment liquid may be bottled in a container such as a gallon bottle and a coated bottle after the production, and then may be transported and stored.

From the viewpoint of preventing changes in components in the treatment liquid during storage, it is preferable that the inside of the container is replaced with inert gas (for example, nitrogen, argon, or the like) having a purity of 99.99995% by volume or more, and it is more preferable to use inert gas with a low moisture content.

A temperature for transportation and storage may be controlled to room temperature (25° C.) or −20° C. to 20° C.

[Dilution Step]

The treatment liquid may be used for cleaning as a treatment liquid (diluted treatment liquid) which has been diluted after undergoing a dilution step of diluting the treatment liquid with a diluent such as water.

The diluted treatment liquid is also an aspect of the treatment liquid according to the embodiment of the present invention as long as the requirements of the present invention are satisfied.

A dilution ratio of the treatment liquid in the dilution step can be appropriately adjusted according to the type and content of each component which can be contained in the treatment liquid, the semiconductor substrate as an object to be cleaned, and the like.

The dilution ratio of the diluted treatment liquid to the treatment liquid before the dilution is preferably 10 to 10,000 times, more preferably 20 to 3,000 times, and still more preferably 50 to 1,000 times, in terms of mass ratio or volume ratio (volume ratio at 23° C.).

From the viewpoint that it has more excellent defect inhibition performance, the treatment liquid is preferably diluted with water.

That is, it is also preferable that the treatment liquid (diluted treatment liquid) contains each component (excluding water) which can be contained in the above-described treatment liquid in an amount obtained by dividing a suitable content of the each component by the dilution ratio in the above-described range (for example, 100). In other words, the suitable content of each component (excluding water) with respect to the total mass of the diluted treatment liquid is an amount obtained, for example, by dividing the amount described as the suitable content of each component with respect to the total mass of the treatment liquid (treatment liquid before the dilution) by the dilution ratio in the above-described range (for example, 100).

A change in pH before and after the dilution (a difference between the pH of the treatment liquid before the dilution and the pH of the diluted treatment liquid) is preferably 2.5 or less, more preferably 1.8 or less, and still more preferably 1.5 or less. The lower limit thereof is preferably 0.1 or more.

It is preferable that the pH of the treatment liquid before the dilution and the pH of the diluted treatment liquid are each in the above-described suitable aspect.

The dilution step may be carried out according to the above-described liquid preparation step of the treatment liquid. Examples of a stirring device and a stirring method used in the dilution step include known stirring devices and stirring methods used in the above-described liquid preparation step.

It is preferable that the water used in the dilution step is subjected to the purification treatment before use. In addition, it is also preferable to carry out the purification treatment on the diluted treatment liquid obtained in the dilution step.

Examples of the purification treatment include the ion component reducing treatment using the ion exchange resin, the RO membrane, or the like, and the foreign matter removal using filtering, which are described as the purification treatment for the treatment liquid above, and it is preferable to carry out any one of these treatments.

[Clean Room]

It is preferable that handlings such as production of the treatment liquid, opening and cleaning of the container, and filling of the treatment liquid, treatment analysis, and measurements are all performed in a clean room.

It is preferable that the clean room meets the 14644-1 clean room standard. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

[Application of Treatment Liquid]

The treatment liquid is preferably used in a cleaning step of cleaning a semiconductor substrate, and more preferably used in a cleaning step of cleaning a semiconductor substrate which has been subjected to a CMP treatment. In addition, the treatment liquid can also be used for cleaning a semiconductor substrate in a process of manufacturing a semiconductor substrate.

As described above, for the cleaning of the semiconductor substrate, the diluted treatment liquid obtained by diluting the treatment liquid may be used.

<Object to be Cleaned>

Examples of an object to be cleaned by the treatment liquid include a semiconductor substrate having a metal-containing substance.

Examples of a semiconductor substrate having a Cu-containing substance include a semiconductor substrate having a Cu-containing metal wire and/or a Cu-containing plug material.

Examples of a metal contained in the metal-containing substance include at least one metal M selected from the group consisting of Cu (copper), Al (aluminum), Ru (ruthenium), Co (cobalt), W (tungsten), Ti (titanium), Ta (tantalum), Cr (chromium), Hf (hafnium), Os (osmium), Pt (platinum), Ni (nickel), Mn (manganese), Zr (zirconium), Pd (palladium), Mo (molybdenum), La (lanthanum), and Ir (iridium).

The metal-containing substance may be any substance containing a metal (a metal atom), and examples thereof include a single body of the metal M, an alloy containing the metal M, an oxide of the metal M, a nitride of the metal M, and an oxynitride of the metal M.

The metal-containing substance may be a mixture containing two or more of these compounds.

The above-described oxide, the above-described nitride, and the above-described oxynitride may be respectively any of a composite oxide containing the metal, a composite nitride containing the metal, or a composite oxynitride containing the metal.

A content of the metal atom in the metal-containing substance is preferably 10% by mass or more, more preferably 30% by mass or more, and still more preferably 50% by mass or more with respect to the total mass of the metal-containing substance. The upper limit thereof is preferably 100% by mass or less.

The semiconductor substrate preferably has the metal M-containing substance containing the metal M; more preferably has a metal-containing substance containing at least one metal selected from the group consisting of Cu, Al, W, Co, Ti, Ta, Ru, and Mo; still more preferably has a metal-containing substance containing at least one metal selected from the group consisting of Cu, W, Co, Ru, and Mo; and particularly preferably has a metal-containing substance containing Cu metal.

Examples of the semiconductor substrate, which is the object to be cleaned by the treatment liquid, include a substrate having a metal wiring line film, a barrier metal, and an insulating film on a surface of a wafer constituting the semiconductor substrate.

Examples of the wafer constituting the semiconductor substrate include a wafer consisting of a silicon-based material, such as a silicon (Si) wafer, a silicon carbide (SiC) wafer, and a silicon-including resin-based wafer (glass epoxy wafer), a gallium phosphorus (GaP) wafer, a gallium arsenic (GaAs) wafer, and an indium phosphorus (InP) wafer.

Examples of the silicon wafer include an n-type silicon wafer in which a silicon wafer is doped with a pentavalent atom (for example, phosphorus (P), arsenic (As), antimony (Sb), or the like) and a p-type silicon wafer in which a silicon wafer is doped with a trivalent atom (for example, boron (B), gallium (Ga), or the like). Examples of the silicon of the silicon wafer include amorphous silicon, single crystal silicon, polycrystalline silicon, and polysilicon.

Among these, a wafer consisting of a silicon-based material, such as a silicon wafer, a silicon carbide wafer, and a resin-based wafer (a glass epoxy wafer) including silicon, is preferable.

The semiconductor substrate may have an insulating film on the above-described wafer.

Examples of the insulating film include a silicon oxide film (for example, a silicon dioxide ($SiO_2$) film, a tetraethyl orthosilicate ($Si(OC_2H_5)_4$) film (a TEOS film), a silicon nitride film (for example, silicon nitride ($Si_3N_4$), and silicon nitride carbide (SiNC)), and a low-dielectric-constant (Low-k) film (for example, a carbon-doped silicon oxide (SiOC) film and a silicon carbide (SiC) film); and a low-dielectric-constant (Low-k) film is preferable.

The metal-containing substance is also preferably a metal film containing a metal.

The metal film included in the semiconductor substrate is preferably a metal film containing the metal M; more preferably a metal film containing at least one metal selected from the group consisting of Cu, Al, W, Co, Ti, Ta, Ru, and Mo; still more preferably a metal film containing at least one metal selected from the group consisting of Cu, W, Co, Ru, and Mo; and particularly preferably a metal film containing Cu metal.

Examples of the metal film containing at least one metal selected from the group consisting of W, Co, Cu, and Ru include a film containing W as a main component (a W-containing film), a film containing Co as a main component (a Co-containing film), a film containing Cu as a main component (a Cu-containing film), and a film containing Ru as a main component (a Ru-containing film).

The "main component" means a component of the highest content among components in the metal film.

It is also preferable that the semiconductor substrate has a Cu-containing film (metal film containing Cu as a main component).

Examples of the Cu-containing film include a wiring line film consisting of only metal Cu (Cu wiring line film) and a wiring line film made of an alloy consisting of metal Cu and another metal (Cu alloy wiring line film).

Specific examples of the Cu alloy wiring line film include a wiring line film made of an alloy consisting of at least one metal selected from the group consisting of Al, Ti, Cr, Mn, Ta, and W, and Cu. Specific examples thereof include a Cu—Al alloy wiring line film, a Cu—Ti alloy wiring line film, a Cu—Cr alloy wiring line film, a Cu—Mn alloy wiring line film, a Cu—Ta alloy wiring line film, and a Cu—W alloy wiring line film.

Examples of the Ru-containing film include a metal film consisting of only metal Ru (Ru metal film) and a metal film made of an alloy consisting of metal Ru and another metal (Ru alloy metal film). The Ru-containing film is often used as a barrier metal.

Examples of the W-containing film (metal film containing W as a main component) include a metal film consisting of only metal W (W metal film) and a metal film made of an alloy consisting of W and another metal (W alloy metal film).

Examples of the W alloy metal film include a W—Ti alloy metal film and a W—Co alloy metal film.

The W-containing film is used, for example, as a barrier metal or a connecting portion between a via and a wiring line.

Examples of the Co-containing film (metal film containing Co as a main component) include a metal film consisting of only metal Co (Co metal film) and a metal film made of an alloy consisting of metal Co and another metal (Co alloy metal film).

Specific examples of the Co alloy metal film include a metal film made of an alloy consisting of at least one metal selected from the group consisting of Ti, Cr, Fe, Ni, Mo, Pd, Ta, and W, and cobalt. Specific examples thereof include a Co—Ti alloy metal film, a Co—Cr alloy metal film, a Co—Fe alloy metal film, a Co—Ni alloy metal film, a Co—Mo alloy metal film, a Co—Pd alloy metal film, a Co—Ta alloy metal film, and a Co—W alloy metal film.

In addition, the treatment liquid is preferably used for cleaning a substrate that has, on a wafer constituting a semiconductor substrate, a metal film (cobalt barrier metal) consisting of only metal Co, which is a barrier metal of the copper-containing wiring line film, and at least a Cu-containing wiring line film, where the Cu-containing wiring line film and the cobalt barrier metal are in contact with each other on the surface of the substrate.

Examples of a method for forming the insulating film, the Ru-containing film, the W-containing film, the Cu-containing film, and the Co-containing film described above on the wafer constituting the semiconductor substrate include known methods.

Examples of the method of forming the insulating film include a method in which the wafer constituting a semiconductor substrate is subjected to a heat treatment in the presence of oxygen gas to form a silicon oxide film, and then a gas of silane and ammonia is introduced thereto to form a silicon nitride film by a chemical vapor deposition (CVD) method.

Examples of the method of forming the Ru-containing film, the W-containing film, the Cu-containing film, and the Co-containing include a method of forming a circuit on a wafer having the above-described insulating film by a known method such as a resist, and then forming a Ru-containing film, a W-containing film, a Cu-containing film, and a Co-containing film according to a method such as plating and a CVD method.

<CMP Treatment>

The CMP treatment is a treatment in which a surface of a substrate having the metal wiring line film, the barrier metal, and the insulating film is flattened by a combined action of a chemical action and a mechanical polishing using a polishing slurry including polishing fine particles (abrasive grains).

A surface of the semiconductor substrate, which has been subjected to the CMP treatment, may have impurities remaining thereon, such as abrasive grains (for example, silica and alumina) used in the CMP treatment, a polished metal wiring line film, and metal impurities (metal residue) derived from the barrier metal. In addition, organic impurities derived from a CMP treatment liquid used in the CMP treatment may remain. For example, since these impurities may cause a short-circuit between wiring lines and deteriorate electrical characteristics of the semiconductor substrate, the semiconductor substrate which has been subjected to the CMP treatment is subjected to a cleaning treatment for removing these impurities from the surface.

Examples of the semiconductor substrate which has been subjected to the CMP treatment include substrates which have been subjected to the CMP treatment, described in Journal of the Japan Society for Precision Engineering, Vol. 84, No. 3, 2018.

<Buffing Treatment>

The surface of the semiconductor substrate which is the object to be cleaned by the treatment liquid may be subjected to the CMP treatment and then to a buffing treatment.

The buffing treatment is a treatment of reducing impurities on the surface of the semiconductor substrate using a polishing pad. Specifically, the surface of the semiconductor substrate which has been subjected to the CMP treatment is brought into contact with the polishing pad, and the semiconductor substrate and the polishing pad are relatively slid while supplying a composition for the buffing treatment to a contact portion. As a result, impurities on the surface of the semiconductor substrate are removed by a frictional force of the polishing pad and a chemical action of a composition for the buffing treatment.

As the composition for the buffing treatment, a known composition for the buffing treatment can be appropriately used depending on the type of the semiconductor substrate, and the type and amount of the impurities to be removed. Examples of components contained in the composition for a buffing treatment include a water-soluble polymer such as polyvinyl alcohol, water as a dispersion medium, and an acid such as nitric acid.

In addition, as the buffing treatment, it is preferable that the semiconductor substrate is buffed using the above-described treatment liquid as the composition for the buffing treatment.

A polishing device, polishing conditions, and the like, which are used in the buffing treatment, can be appropriately selected from known devices and conditions according to the type of the semiconductor substrate, the object to be removed, and the like. Examples of the buffing treatment include treatments described in paragraphs to of WO2017/169539A, the contents of which are incorporated herein by reference.

[Cleaning Method]

As the cleaning method using the treatment liquid, a method for cleaning a semiconductor substrate is preferable.

The method for cleaning a semiconductor substrate is not particularly limited as long as it includes a cleaning step of cleaning a substrate using the above-described treatment liquid.

The above-described semiconductor substrate is preferably a semiconductor substrate which has been subjected to the CMP treatment.

The cleaning method of a semiconductor substrate also preferably includes a step of applying the diluted treatment liquid obtained in the above-described dilution step to the semiconductor substrate which has been subjected to the CMP treatment to carry out cleaning.

Examples of the cleaning step of cleaning a semiconductor substrate using the treatment liquid include a known method which is carried out on a CMP-treated semiconductor substrate.

Specifically, in scrub cleaning in which a cleaning member such as a brush is physically brought into contact with a surface of the semiconductor substrate while supplying the treatment liquid to the semiconductor substrate to remove residues, and in immersion-type cleaning such as an immersion in which a semiconductor substrate is immersed in the treatment liquid, a spinning (dropping) in which the treatment liquid is dropped while rotating a semiconductor substrate, and a spraying in which the treatment liquid is sprayed, from the viewpoint that the impurities remaining on the surface of the semiconductor substrate can be further reduced, it is preferable to carry out a ultrasonic treatment to the treatment liquid in which the semiconductor substrate is immersed.

The above-described cleaning step may be carried out once or twice or more. In a case of carrying out the cleaning twice or more, the same method may be repeated or different methods may be combined.

The cleaning method of a semiconductor substrate may be a single-wafer method or a batch method.

The single-wafer method is a method of treating semiconductor substrates one by one, and the batch method is a method of treating a plurality of semiconductor substrates at the same time.

A temperature of the treatment liquid used in for cleaning a semiconductor substrate is not particularly limited.

Examples of the temperature of the above-described treatment liquid include room temperature (25° C.), and from the viewpoint of improving cleaning performance and suppressing damage to members, the temperature is preferably 10° C. to 60° C. and more preferably 15° C. to 50° C.

It is preferable that a pH of the treatment liquid and a pH of the diluted treatment liquid are each in the above-described suitable aspect of pH.

A cleaning time in the cleaning of the semiconductor substrate can be appropriately changed depending on the type, content, and the like of the components contained in the treatment liquid. The above-described cleaning time is preferably 10 to 120 seconds, more preferably 20 to 90 seconds, and still more preferably 30 to 60 seconds.

A supply amount (supply rate) of the treatment liquid in the cleaning step of the semiconductor substrate is preferably 50 to 5,000 mL/min and more preferably 500 to 2,000 mL/min.

In the cleaning of the semiconductor substrate, a mechanical stirring method may be used in order to further improve the cleaning performance of the treatment liquid.

Examples of the mechanical stirring method include a method of circulating the treatment liquid on the semiconductor substrate, a method of flowing or spraying the treatment liquid on the semiconductor substrate, and a method of stirring the treatment liquid with ultrasonic wave or megasonic wave.

After the above-described cleaning of the semiconductor substrate, a rinsing step of rinsing and washing the semiconductor substrate with a solvent may be carried out.

The rinsing step is preferably a step which is carried out continuously subsequently after the cleaning step of the semiconductor substrate, in which the rinsing is carried out with a rinsing solvent (rinsing liquid) over 5 to 300 seconds. The rinsing step may be carried out using the above-described mechanical stirring method.

Examples of the rinsing solvent include water (preferably deionized water), methanol, ethanol, isopropyl alcohol, N-methylpyrrolidinone, γ-butyrolactone, dimethyl sulfoxide, ethyl lactate, and propylene glycol monomethyl ether acetate. In addition, an aqueous rinsing liquid having a pH of more than 8.0 (aqueous ammonium hydroxide which has been diluted, or the like) may be used.

Examples of the method of bringing the rinsing solvent into contact with the semiconductor substrate include the above-described method of bringing the treatment liquid into contact with the treatment liquid.

After the above-described rinsing step, a drying step of drying the semiconductor substrate may be carried out.

Examples of the drying method include a spin drying method, a method of flowing a dry gas onto a semiconductor substrate, a method of heating a substrate by a heating unit such as a hot plate and an infrared lamp, a Marangoni drying method, a Rotagoni drying method, an isopropyl alcohol (IPA) drying method, and a method of combining these methods.

[Manufacturing Method of Semiconductor Device or Semiconductor Element]

The manufacturing method of a semiconductor device or a semiconductor element according to the present invention is not particularly limited as long as it is a manufacturing method using the above-described cleaning method, and examples thereof include a known method such as a manufacturing method of a semiconductor element.

EXAMPLES

Hereinafter, the present invention will be described in more detail with reference to Examples. The materials, the amounts of the materials to be used, the proportions, and the like shown in the Examples below may be modified as appropriate as long as the modifications do not depart from the spirit of the present invention. Accordingly, the scope of the present invention should not be construed as being limited to Examples shown below.

In the following Examples, a pH of the treatment liquid was measured at 25° C. using a pH meter (manufactured by HORIBA, Ltd., F-74) in accordance with JIS Z8802-1984.

In addition, in the production of treatment liquids of Examples and Comparative Examples, all of handling of a container, and production, filling, storage, and analytical measurement of the treatment liquids were performed in a clean room satisfying a level of ISO Class 2 or lower.

[Raw Materials of Treatment Liquid]

The following components were used to produce a treatment liquid. As various components used in Examples, those all classified into a semiconductor grade or a high-purity grade equivalent thereto were used.

A Clog P shown below was a value calculated using ChemDraw Professional (Version: 16.0.1.4 (77), manufactured by PerkinElmer Inc.).

[Specific Compound]

A-1: ethyltrimethylammonium hydroxide (molecular weight: 105.2, Clog P: −4.53)

A-2: tetraethylammonium hydroxide (molecular weight: 147.3, Clog P: −3.14)

A-3: tetrapropylammonium hydroxide (molecular weight: 203.4, Clog P: −1.02)

A-4: tetrabutylammonium hydroxide (molecular weight: 259.5, Clog P: 1.09)
A-5: 2-hydroxyethyltrimethylammonium hydroxide (molecular weight: 121.2, Clog P: −4.36)
A-6: trihydroxyethylmethylammonium hydroxide (molecular weight: 181.2, Clog P: −2.58)
A-7: tri((hydroxyethoxy)ethyl)methylammonium hydroxide (molecular weight: 313.4, Clog P: −2.39)
A-8: 1,3-dihydroxypropyltrimethylammonium hydroxide (molecular weight: 151.2, Clog P: −3.04)
A-9: $N^1$-(1-hydroxy-2-methylpropan-2-yl)-$N^2$-(2-hydroxypropyl)-$N^1$,$N^1$,—$N^2$,$N^2$,2-pentamethylpropane-1,2-diaminium dihydroxide (molecular weight: 310.5, Clog P: −3.85)
A-10: dimethyldioctadecylammonium chloride (molecular weight: 586.5, Clog P: 12.73)
A-11: N,N'-ethylenebis(trimethylammonium) dihydroxide (molecular weight: 180.3, Clog P: −7.36)
A-12: decamethonium bromide (molecular weight: 418.3, Clog P: −6.97)
A-13: tetrabutylphosphonium hydroxide (molecular weight: 276.5, Clog P: 2.19)
A-14: tetraphenylphosphonium bromide (molecular weight: 339.4, Clog P: 7.57)
[Comparative Compound]
a-1: tetramethylammonium hydroxide (molecular weight: 91.2, Clog P: −4.86)

[Sulfur-Containing Compound]
B-1: L-cysteine (cysteine) (molecular weight: 121.2, Clog P: −2.35)
B-2: cysteamine (molecular weight: 77.2, Clog P: −0.25)
B-3: N-acetyl-L-cysteine (N-acetylcysteine) (molecular weight: 163.2, Clog P: −0.62)
B-4: thioglycerol (molecular weight: 108.2, Clog P: −0.78)
B-5: mercaptopropionic acid (molecular weight: 106.1, Clog P: 0.16)
B-6: mercaptosuccinic acid (molecular weight: 150.2, Clog P: −0.83)
B-7: meso-2,3-dimercaptosuccinic acid (molecular weight: 182.2, Clog P: −1.48)
B-8: mercaptotriazole (molecular weight: 101.1, Clog P: 0.53)
B-9: 2-amino-1,3,4-thiadiazole (molecular weight: 101.1, Clog P: −0.46)
B-10: tetramethylthiourea (molecular weight: 132.2, Clog P: 0.49)
B-11: cystine (molecular weight: 240.3, Clog P: −4.46)
B-12: N,N'-diacetylcystine (molecular weight: 324.4, Clog P: −0.98)
B-13: naphthalene sulfonate formalin condensate Na salt, “LAVELIN FD-40”, manufactured by DKS Co., Ltd.
B-14: sulfuric acid (molecular weight: 98.1, Clog P: −2.17)

[Compound X]
C-1: propylene glycol
C-2: ethylene glycol
C-3: 1,3-propanediol
C-4: 2-butoxyethanol

[Amine Compound]
D-1: monoethanolamine
D-2: N-methyldiethanolamine
D-3: 2-(dimethylamino)-1,3-propanediol
D-4: diazabicycloundecene
D-5: diazabicyclononene
D-6: guanidine
D-7: tetramethylguanidine

[Anticorrosion Agent]
E-1: adenine
E-2: guanine
E-3: xanthine
E-4: 1,2,4-triazole

[Organic Acid and Inorganic Acid]
F-1: citric acid
F-2: succinic acid
F-3: tartaric acid
F-4: phosphoric acid

[Others]
<Polymer>
G-1: polyacrylic acid (Mw=700,000), “JURYMER AC-10H”, manufactured by Toagosei Co., Ltd.
G-2: polyacrylic acid (Mw=55,000), “JURYMER AC-10L”, manufactured by Toagosei Co., Ltd.
G-3: polyacrylic acid (Mw=6,000), “ARON A-10SL”, manufactured by Toagosei Co., Ltd.
G-4: polymaleic acid (Mw=2,000), “NONPOL PWA-50W”, manufactured by NOF Corporation
G-5: styrene-maleic acid copolymer, “DKS DISCOAT N-10”, manufactured by DKS Co., Ltd.
G-6: styrene-maleic acid half ester copolymer, “DKS DISCOAT N-14”, manufactured by DKS Co., Ltd.
<Oxidant>
G-7: iodic acid
G-8: periodic acid
<Antibacterial Agent>
G-9: sorbic acid

[Water]
Water: ultrapure water, manufactured by FUJIFILM Wako Chemicals Corporation

[Production of Treatment Liquid]

The specific compound A-1 and the sulfur-containing compound B-1 were added to the ultrapure water in amounts that the finally obtained treatment liquid had the formulation shown in the table below, and then the mixture was sufficiently stirred to obtain a treatment liquid of Example 1. Treatment liquids other than Example 1 were each produced according to the production method of Example 1. No pH adjusting agent was used in the production of the treatment liquids of Examples and Comparative Examples.

[Evaluation]

[Removability of Hydrophobic Anticorrosion Agent]

The treatment liquid of any one of each of Examples and Comparative Examples was diluted 100-fold (weight ratio) with water to prepare each diluted treatment liquid.

A copper substrate cut into 2 cm×2 cm was treated with a 1% by mass citric acid aqueous solution to remove a natural oxide film from the copper substrate. The obtained copper substrate was immersed in an alkaline aqueous solution (pH: 9.5) of 0.5% by mass 5-methylbenzotriazole (hydrophobic anticorrosion agent) for 30 minutes, and 5-methylbenzotriazole was attached on the surface of the copper substrate. 50 mL of any one of the above-described diluted treatment liquids was weighed in a glass beaker, and the copper substrate to which 5-methylbenzotriazole had been attached was subjected to an immersion treatment for 3 minutes at room temperature with a stirrer rotating at 400 rpm. Further, with the copper substrate after the above-described treatment, 5-methylbenzotriazole was extracted with a 0.1 N hydrochloric acid aqueous solution. A concentration of the 5-methylbenzotriazole in the above-described hydrochloric acid aqueous solution was measured by high performance liquid chromatography (HPLC), and was defined as a concentration of 5-methylbenzotriazole after the above-described immersion treatment.

In addition, with the copper substrate to which 5-methylbenzotriazole had been attached, without performing the above-described immersion treatment, 5-methylbenzotriazole was extracted with a 0.1 N hydrochloric acid aqueous solution. A concentration of the 5-methylbenzotriazole in the above-described hydrochloric acid aqueous solution was measured by HPLC, and was defined as a concentration of 5-methylbenzotriazole before the treatment.

From each of the obtained concentrations, a removal rate was calculated by the following expression to evaluate removability of the hydrophobic anticorrosion agent (5-methylbenzotriazole).

$$\text{Removal rate of hydrophobic anticorrosion agent (\%)} = \{1 - (\text{Concentration of 5-methylbenzotriazole after treatment}) / (\text{Concentration of 5-methylbenzotriazole before treatment})\} \times 100$$

10: removal rate was 95% or more and 100% or less.
9: removal rate was 90% or more and less than 95%.
8: removal rate was 85% or more and less than 90%.
7: removal rate was 80% or more and less than 85%.
6: removal rate was 75% or more and less than 80%.
5: removal rate was 70% or more and less than 75%.
4: removal rate was 65% or more and less than 70%.
3: removal rate was 60% or more and less than 65%.
2: removal rate was 50% or more and less than 60%.
1: removal rate was less than 50%.

[Suppression Property of Copper Surface Roughness]

The treatment liquid of any one of each of Examples and Comparative Examples was diluted 100-fold (weight ratio) with water to prepare each diluted treatment liquid.

A copper substrate cut into 2 cm×2 cm was treated with a 1% by mass citric acid aqueous solution to remove a natural oxide film. 50 mL of the above-described diluted treatment liquid was weighed in a glass beaker, and the above-described copper substrate was subjected to an immersion treatment for 3 minutes at room temperature with a stirrer rotating at 400 rpm. A surface roughness Ra of a surface of the copper substrate after the above-described treatment was measured using an atomic force microscope (AFM) to evaluate suppression property of the copper surface roughness.

10: Ra was 3 Å or less.
9: Ra was more than 3 Å and 5 Å or less.
8: Ra was more than 5 Å and 10 Å or less.
7: Ra was more than 10 Å and 15 Å or less.
6: Ra was more than 15 Å and 20 Å or less.
5: Ra was more than 20 Å and 25 Å or less.
4: Ra was more than 25 Å and 30 Å or less.
3: Ra was more than 30 Å and 40 Å or less.
2: Ra was more than 40 Å and 50 Å or less.
1: Ra was more than 50 Å.

[Result]

In the tables, the column of "Content (% by mass" indicates the content (% by mass) of each component with respect to the total mass of the treatment liquid.

The column of "A/B" indicates the mass ratio of the specific compound to the sulfur-containing compound (mass of specific compound/mass of sulfur-containing compound).

The column of "B/C" indicates the mass ratio of the sulfur-containing compound to the compound X (mass of sulfur-containing compound/mass of compound X).

The column of "B/D" indicates the mass ratio of the sulfur-containing compound to the amine compound (mass of sulfur-containing compound/mass of amine compound).

The column of "pH before dilution" indicates the pH of the treatment liquid before dilution.

The column of "pH after dilution" indicates the pH of the treatment liquid (diluted treatment liquid) after being diluted 100 times.

The above-described pH indicates a pH measured by a pH meter at 25° C.

The "Remainder" of "Water" indicates the remaining components (remainder) which are not the components specified as the components of the treatment liquid in the tables.

TABLE 1

| | Composition of treatment liquid | | | | | | | | | | | | | | | | |
|---|---|---|---|---|---|---|---|---|---|---|---|---|---|---|---|---|---|
| | A | | | | B | | | | | C | | | | | D | | |
| | Compound | | Compound | | Sulfur-containing compound | | Sulfur-containing compound | | | Compound X | | Compound X | | | Amine compound | | |
| | Type | Content % by mass | Type | Content % by mass | Type | Content % by mass | Type | Content % by mass | A/B | Type | Content % by mass | Type | Content % by mass | B/C | Type | Content % by mass | B/D |
| Example 1 | A-1 | 10.0 | — | — | B-1 | 1.0 | — | — | 10.0 | — | — | — | — | — | — | — | — |
| Example 2 | A-1 | 5.0 | — | — | B-1 | 1.0 | — | — | 5.0 | — | — | — | — | — | — | — | — |
| Example 3 | A-1 | 2.5 | — | — | B-1 | 1.0 | — | — | 2.5 | — | — | — | — | — | — | — | — |
| Example 4 | A-1 | 1.0 | — | — | B-1 | 1.0 | — | — | 1.0 | — | — | — | — | — | — | — | — |
| Example 5 | A-1 | 0.1 | — | — | B-1 | 1.0 | — | — | 0.1 | — | — | — | — | — | — | — | — |
| Example 6 | A-2 | 5.0 | — | — | B-1 | 1.0 | — | — | 5.0 | — | — | — | — | — | — | — | — |
| Example 7 | A-3 | 5.0 | — | — | B-1 | 1.0 | — | — | 5.0 | — | — | — | — | — | — | — | — |
| Example 8 | A-4 | 5.0 | — | — | B-1 | 1.0 | — | — | 5.0 | — | — | — | — | — | — | — | — |
| Example 9 | A-5 | 5.0 | — | — | B-1 | 1.0 | — | — | 5.0 | — | — | — | — | — | — | — | — |
| Example 10 | A-6 | 5.0 | — | — | B-1 | 1.0 | — | — | 5.0 | — | — | — | — | — | — | — | — |
| Example 11 | A-7 | 5.0 | — | — | B-1 | 1.0 | — | — | 5.0 | — | — | — | — | — | — | — | — |
| Example 12 | A-8 | 5.0 | — | — | B-1 | 1.0 | — | — | 5.0 | — | — | — | — | — | — | — | — |
| Example 13 | A-9 | 5.0 | — | — | B-1 | 1.0 | — | — | 5.0 | — | — | — | — | — | — | — | — |
| Example 14 | A-10 | 1.0 | A-1 | 5.0 | B-1 | 1.0 | — | — | 6.0 | — | — | — | — | — | — | — | — |
| Example 15 | A-11 | 1.0 | A-1 | 5.0 | B-1 | 1.0 | — | — | 6.0 | — | — | — | — | — | — | — | — |

TABLE 1-continued

| | Composition of treatment liquid | | | | | | | | | | | | | | | | |
|---|---|---|---|---|---|---|---|---|---|---|---|---|---|---|---|---|---|
| | A | | | | B | | | | | C | | | | | D Amine compound | | |
| | Compound | | Compound | | Sulfur-containing compound | | Sulfur-containing compound | | | Compound X | | Compound X | | | | | |
| | Type | Content % by mass | Type | Content % by mass | Type | Content % by mass | Type | Content % by mass | A/B | Type | Content % by mass | Type | Content % by mass | B/C | Type | Content % by mass | B/D |
| Example 16 | A-12 | 1.0 | A-1 | 5.0 | B-1 | 1.0 | — | — | 6.0 | — | — | — | — | — | — | — | — |
| Example 17 | A-13 | 5.0 | — | — | B-1 | 1.0 | — | — | 5.0 | — | — | — | — | — | — | — | — |
| Example 18 | A-14 | 1.0 | A-1 | 5.0 | B-1 | 1.0 | — | — | 6.0 | — | — | — | — | — | — | — | — |
| Example 19 | A-1 | 4.0 | a-1 | 1.0 | B-1 | 1.0 | — | — | 5.0 | — | — | — | — | — | — | — | — |
| Example 20 | A-1 | 5.0 | — | — | B-1 | 2.0 | — | — | 2.5 | — | — | — | — | — | — | — | — |
| Example 21 | A-1 | 5.0 | — | — | B-1 | 0.5 | — | — | 10.0 | — | — | — | — | — | — | — | — |
| Example 22 | A-1 | 5.0 | — | — | B-1 | 0.1 | — | — | 50.0 | — | — | — | — | — | — | — | — |
| Example 23 | A-1 | 5.0 | — | — | B-1 | 0.05 | — | — | 100.0 | — | — | — | — | — | — | — | — |
| Example 24 | A-1 | 1.0 | — | — | B-1 | 0.1 | — | — | 10.0 | — | — | — | — | — | — | — | — |
| Example 25 | A-1 | 5.0 | — | — | B-2 | 1.0 | — | — | 5.0 | — | — | — | — | — | — | — | — |
| Example 26 | A-1 | 5.0 | — | — | B-3 | 1.0 | — | — | 5.0 | — | — | — | — | — | — | — | — |
| Example 27 | A-1 | 5.0 | — | — | B-4 | 1.0 | — | — | 5.0 | — | — | — | — | — | — | — | — |
| Example 28 | A-1 | 5.0 | — | — | B-5 | 1.0 | — | — | 5.0 | — | — | — | — | — | — | — | — |
| Example 29 | A-1 | 5.0 | — | — | B-6 | 1.0 | — | — | 5.0 | — | — | — | — | — | — | — | — |
| Example 30 | A-1 | 5.0 | — | — | B-7 | 1.0 | — | — | 5.0 | — | — | — | — | — | — | — | — |
| Example 31 | A-1 | 5.0 | — | — | B-8 | 1.0 | — | — | 5.0 | — | — | — | — | — | — | — | — |
| Example 32 | A-1 | 5.0 | — | — | B-9 | 1.0 | — | — | 5.0 | — | — | — | — | — | — | — | — |
| Example 33 | A-1 | 5.0 | — | — | B-10 | 1.0 | — | — | 5.0 | — | — | — | — | — | — | — | — |
| Example 34 | A-1 | 5.0 | — | — | B-11 | 1.0 | — | — | 5.0 | — | — | — | — | — | — | — | — |
| Example 35 | A-6 | 5.0 | — | — | B-3 | 1.0 | — | — | 5.0 | — | — | — | — | — | — | — | — |
| Example 36 | A-6 | 5.0 | — | — | B-8 | 1.0 | — | — | 5.0 | — | — | — | — | — | — | — | — |
| Example 37 | A-6 | 5.0 | — | — | B-10 | 1.0 | — | — | 5.0 | — | — | — | — | — | — | — | — |
| Example 38 | A-1 | 5.0 | — | — | B-1 | 0.5 | B-11 | 0.5 | 5.0 | — | — | — | — | — | — | — | — |
| Example 39 | A-1 | 5.0 | — | — | B-3 | 0.5 | B-12 | 0.5 | 5.0 | — | — | — | — | — | — | — | — |
| Example 40 | A-1 | 5.0 | — | — | B-1 | 0.5 | B-10 | 0.5 | 5.0 | — | — | — | — | — | — | — | — |
| Example 41 | A-1 | 5.0 | — | — | B-1 | 1.0 | — | — | 5.0 | C-1 | 1.0 | — | — | 1.0 | — | — | — |
| Example 42 | A-1 | 5.0 | — | — | B-1 | 1.0 | — | — | 5.0 | C-1 | 0.5 | — | — | 2.0 | — | — | — |
| Example 43 | A-1 | 5.0 | — | — | B-1 | 1.0 | — | — | 5.0 | C-1 | 0.1 | — | — | 10.0 | — | — | — |
| Example 44 | A-1 | 5.0 | — | — | B-10 | 1.0 | — | — | 5.0 | C-1 | 1.0 | — | — | 1.0 | — | — | — |
| Example 45 | A-1 | 5.0 | — | — | B-1 | 1.0 | — | — | 5.0 | C-2 | 1.0 | — | — | 1.0 | — | — | — |
| Example 46 | A-1 | 5.0 | — | — | B-1 | 1.0 | — | — | 5.0 | C-3 | 1.0 | — | — | 1.0 | — | — | — |
| Example 47 | A-1 | 5.0 | — | — | B-1 | 1.0 | — | — | 5.0 | C-4 | 1.0 | — | — | 1.0 | — | — | — |
| Example 48 | A-1 | 5.0 | — | — | B-1 | 0.1 | — | — | 50.0 | C-1 | 1.0 | — | — | 0.1 | — | — | — |
| Example 49 | A-1 | 1.0 | — | — | B-1 | 0.1 | — | — | 10.0 | C-1 | 0.5 | — | — | 0.2 | — | — | — |
| Example 50 | A-6 | 5.0 | — | — | B-3 | 1.0 | — | — | 5.0 | C-3 | 1.0 | — | — | 1.0 | — | — | — |
| Example 51 | A-6 | 5.0 | — | — | B-8 | 1.0 | — | — | 5.0 | C-3 | 1.0 | — | — | 1.0 | — | — | — |
| Example 52 | A-6 | 5.0 | — | — | B-10 | 1.0 | — | — | 5.0 | C-3 | 1.0 | — | — | 1.0 | — | — | — |
| Example 53 | A-1 | 5.0 | — | — | B-1 | 1.0 | — | — | 5.0 | C-1 | 0.5 | C-3 | 0.5 | 1.0 | — | — | — |

TABLE 2

Table 2 succession of Table 1

| | Composition of treatment liquid | | | | | | | | | | | |
|---|---|---|---|---|---|---|---|---|---|---|---|---|
| | E Anticorrosion agent | | F Organic acid and inorganic acid | | G Others | | | | | | | |
| | Type | Content % by mass | Type | Content % by mass | Type | Content % by mass | Water Content | pH before dilution | pH after dilution | Dilution rate | Removability of hydrophobic anticorrosion agent | Suppression property of copper surface roughness |
| Example 1 | — | — | — | — | — | — | Remainder | 13.9 | 12.5 | 100 | 6 | 6 |
| Example 2 | — | — | — | — | — | — | Remainder | 13.5 | 11.5 | 100 | 6 | 5 |
| Example 3 | — | — | — | — | — | — | Remainder | 13.0 | 10.5 | 100 | 6 | 4 |
| Example 4 | — | — | — | — | — | — | Remainder | 9.9 | 9.5 | 100 | 6 | 3 |
| Example 5 | — | — | — | — | — | — | Remainder | 9.5 | 9.0 | 100 | 6 | 2 |
| Example 6 | — | — | — | — | — | — | Remainder | 13.5 | 11.5 | 100 | 6 | 4 |
| Example 7 | — | — | — | — | — | — | Remainder | 13.5 | 11.5 | 100 | 6 | 4 |
| Example 8 | — | — | — | — | — | — | Remainder | 13.5 | 11.5 | 100 | 6 | 4 |
| Example 9 | — | — | — | — | — | — | Remainder | 13.5 | 11.5 | 100 | 6 | 4 |
| Example 10 | — | — | — | — | — | — | Remainder | 13.5 | 11.5 | 100 | 6 | 4 |

TABLE 2-continued

Table 2 succession of Table 1

| | Composition of treatment liquid | | | | | | | | | | | |
|---|---|---|---|---|---|---|---|---|---|---|---|---|
| | E Anticorrosion agent | | F Organic acid and inorganic acid | | G Others | | | | | | Removability of hydrophobic anticorrosion agent | Suppression property of copper surface roughness |
| | Type | Content % by mass | Type | Content % by mass | Type | Content % by mass | Water Content | pH before dilution | pH after dilution | Dilution rate | | |
| Example 11 | — | — | — | — | — | — | Remainder | 13.5 | 11.5 | 100 | 6 | 4 |
| Example 12 | — | — | — | — | — | — | Remainder | 13.5 | 11.5 | 100 | 6 | 4 |
| Example 13 | — | — | — | — | — | — | Remainder | 13.5 | 11.5 | 100 | 6 | 4 |
| Example 14 | — | — | — | — | — | — | Remainder | 13.5 | 11.5 | 100 | 6 | 4 |
| Example 15 | — | — | — | — | — | — | Remainder | 13.5 | 11.5 | 100 | 6 | 4 |
| Example 16 | — | — | — | — | — | — | Remainder | 13.5 | 11.5 | 100 | 6 | 4 |
| Example 17 | — | — | — | — | — | — | Remainder | 12.3 | 10.8 | 100 | 6 | 4 |
| Example 18 | — | — | — | — | — | — | Remainder | 13.5 | 11.5 | 100 | 6 | 4 |
| Example 19 | — | — | — | — | — | — | Remainder | 13.5 | 11.5 | 100 | 6 | 3 |
| Example 20 | — | — | — | — | — | — | Remainder | 13.2 | 11.4 | 100 | 7 | 4 |
| Example 21 | — | — | — | — | — | — | Remainder | 13.5 | 11.5 | 100 | 5 | 6 |
| Example 22 | — | — | — | — | — | — | Remainder | 13.6 | 11.6 | 100 | 3 | 7 |
| Example 23 | — | — | — | — | — | — | Remainder | 13.6 | 11.6 | 100 | 2 | 8 |
| Example 24 | — | — | — | — | — | — | Remainder | 12.8 | 10.5 | 100 | 3 | 6 |
| Example 25 | — | — | — | — | — | — | Remainder | 13.5 | 11.5 | 100 | 4 | 5 |
| Example 26 | — | — | — | — | — | — | Remainder | 13.5 | 11.5 | 100 | 4 | 5 |
| Example 27 | — | — | — | — | — | — | Remainder | 13.5 | 11.5 | 100 | 4 | 5 |
| Example 28 | — | — | — | — | — | — | Remainder | 13.5 | 11.5 | 100 | 4 | 5 |
| Example 29 | — | — | — | — | — | — | Remainder | 13.5 | 11.5 | 100 | 4 | 5 |
| Example 30 | — | — | — | — | — | — | Remainder | 13.5 | 11.5 | 100 | 4 | 5 |
| Example 31 | — | — | — | — | — | — | Remainder | 13.5 | 11.5 | 100 | 4 | 5 |
| Example 32 | — | — | — | — | — | — | Remainder | 13.5 | 11.5 | 100 | 4 | 5 |
| Example 33 | — | — | — | — | — | — | Remainder | 13.5 | 11.5 | 100 | 5 | 5 |
| Example 34 | — | — | — | — | — | — | Remainder | 13.5 | 11.5 | 100 | 4 | 5 |
| Example 35 | — | — | — | — | — | — | Remainder | 13.5 | 11.5 | 100 | 4 | 4 |
| Example 36 | — | — | — | — | — | — | Remainder | 13.5 | 11.5 | 100 | 4 | 4 |
| Example 37 | — | — | — | — | — | — | Remainder | 13.5 | 11.5 | 100 | 5 | 4 |
| Example 38 | — | — | — | — | — | — | Remainder | 13.5 | 11.5 | 100 | 7 | 5 |
| Example 39 | — | — | — | — | — | — | Remainder | 13.5 | 11.5 | 100 | 5 | 5 |
| Example 40 | — | — | — | — | — | — | Remainder | 13.5 | 11.5 | 100 | 8 | 5 |
| Example 41 | — | — | — | — | — | — | Remainder | 13.5 | 11.5 | 100 | 9 | 5 |
| Example 42 | — | — | — | — | — | — | Remainder | 13.5 | 11.5 | 100 | 8 | 5 |
| Example 43 | — | — | — | — | — | — | Remainder | 13.5 | 11.5 | 100 | 7 | 5 |
| Example 44 | — | — | — | — | — | — | Remainder | 13.5 | 11.5 | 100 | 8 | 5 |
| Example 45 | — | — | — | — | — | — | Remainder | 13.5 | 11.5 | 100 | 8 | 5 |
| Example 46 | — | — | — | — | — | — | Remainder | 13.5 | 11.5 | 100 | 8 | 5 |
| Example 47 | — | — | — | — | — | — | Remainder | 13.5 | 11.5 | 100 | 8 | 5 |
| Example 48 | — | — | — | — | — | — | Remainder | 13.6 | 11.6 | 100 | 6 | 7 |
| Example 49 | — | — | — | — | — | — | Remainder | 12.8 | 10.5 | 100 | 5 | 6 |
| Example 50 | — | — | — | — | — | — | Remainder | 13.5 | 11.5 | 100 | 6 | 4 |
| Example 51 | — | — | — | — | — | — | Remainder | 13.5 | 11.5 | 100 | 6 | 4 |
| Example 52 | — | — | — | — | — | — | Remainder | 13.5 | 11.5 | 100 | 7 | 4 |
| Example 53 | — | — | — | — | — | — | Remainder | 13.5 | 11.5 | 100 | 10 | 5 |

TABLE 3

| | Composition of treatment liquid | | | | | | | | | | | | | | | | |
|---|---|---|---|---|---|---|---|---|---|---|---|---|---|---|---|---|---|
| | A | | | | B | | | | | C | | | | | D Amine compound | | |
| | Compound | | Compound | | Sulfur-containing compound | | Sulfur-containing compound | | | Compound X | | Compound X | | | | | |
| | Type | Content % by mass | Type | Content % by mass | Type | Content % by mass | Type | Content % by mass | A/B | Type | Content % by mass | Type | Content % by mass | B/C | Type | Content % by mass | B/D |
| Example 54 | A-1 | 5.0 | — | — | B-1 | 1.0 | — | — | 5.0 | — | — | — | — | — | D-1 | 1.0 | 1.0 |
| Example 55 | A-1 | 5.0 | — | — | B-1 | 1.0 | — | — | 5.0 | — | — | — | — | — | D-1 | 0.5 | 2.0 |
| Example 56 | A-1 | 5.0 | — | — | B-1 | 1.0 | — | — | 5.0 | — | — | — | — | — | D-1 | 0.1 | 10.0 |
| Example 57 | A-1 | 5.0 | — | — | B-10 | 1.0 | — | — | 5.0 | — | — | — | — | — | D-1 | 1.0 | 1.0 |
| Example 58 | A-1 | 5.0 | — | — | B-1 | 1.0 | — | — | 5.0 | — | — | — | — | — | D-2 | 1.0 | 1.0 |

TABLE 3-continued

| | Composition of treatment liquid | | | | | | | | | | | | | | | | |
|---|---|---|---|---|---|---|---|---|---|---|---|---|---|---|---|---|---|
| | A | | | | B Sulfur-containing compound | | B Sulfur-containing compound | | | C | | | | | D Amine compound | | |
| | Compound | | Compound | | | | | | | Compound X | | Compound X | | | | | |
| | Type | Content % by mass | Type | Content % by mass | Type | Content % by mass | Type | Content % by mass | A/B | Type | Content % by mass | Type | Content % by mass | B/C | Type | Content % by mass | B/D |
| Example 59 | A-1 | 5.0 | — | — | B-1 | 1.0 | — | — | 5.0 | — | — | — | — | — | D-3 | 1.0 | 1.0 |
| Example 60 | A-1 | 5.0 | — | — | B-1 | 1.0 | — | — | 5.0 | — | — | — | — | — | D-4 | 1.0 | 1.0 |
| Example 61 | A-1 | 5.0 | — | — | B-1 | 1.0 | — | — | 5.0 | — | — | — | — | — | D-5 | 1.0 | 1.0 |
| Example 62 | A-1 | 5.0 | — | — | B-1 | 1.0 | — | — | 5.0 | — | — | — | — | — | D-6 | 1.0 | 1.0 |
| Example 63 | A-1 | 5.0 | — | — | B-1 | 1.0 | — | — | 5.0 | — | — | — | — | — | D-7 | 1.0 | 1.0 |
| Example 64 | A-1 | 5.0 | — | — | B-1 | 1.0 | — | — | 5.0 | — | — | — | — | — | — | — | — |
| Example 65 | A-1 | 5.0 | — | — | B-1 | 1.0 | — | — | 5.0 | — | — | — | — | — | — | — | — |
| Example 66 | A-1 | 5.0 | — | — | B-1 | 1.0 | — | — | 5.0 | — | — | — | — | — | — | — | — |
| Example 67 | A-1 | 5.0 | — | — | B-1 | 1.0 | — | — | 5.0 | — | — | — | — | — | — | — | — |
| Example 68 | A-1 | 5.0 | — | — | B-1 | 1.0 | — | — | 5.0 | — | — | — | — | — | — | — | — |
| Example 69 | A-1 | 5.0 | — | — | B-1 | 1.0 | — | — | 5.0 | — | — | — | — | — | — | — | — |
| Example 70 | A-1 | 5.0 | — | — | B-1 | 1.0 | — | — | 5.0 | — | — | — | — | — | — | — | — |
| Example 71 | A-1 | 5.0 | — | — | B-11 | 1.0 | — | — | 5.0 | — | — | — | — | — | — | — | — |
| Example 72 | A-1 | 5.0 | — | — | B-11 | 1.0 | — | — | 5.0 | — | — | — | — | — | — | — | — |
| Example 73 | A-1 | 5.0 | — | — | B-1 | 1.0 | — | — | 5.0 | — | — | — | — | — | — | — | — |
| Example 74 | A-1 | 5.0 | — | — | B-1 | 1.0 | B-14 | 0.10 | 4.5 | — | — | — | — | — | — | — | — |
| Example 75 | A-1 | 5.0 | — | — | B-1 | 1.0 | — | — | 5.0 | — | — | — | — | — | — | — | — |
| Example 76 | A-1 | 5.0 | — | — | B-1 | 1.0 | — | — | 5.0 | — | — | — | — | — | — | — | — |
| Example 77 | A-1 | 5.0 | — | — | B-1 | 1.0 | — | — | 5.0 | — | — | — | — | — | — | — | — |
| Example 78 | A-1 | 5.0 | — | — | B-1 | 1.0 | — | — | 5.0 | — | — | — | — | — | — | — | — |
| Example 79 | A-1 | 5.0 | — | — | B-1 | 1.0 | — | — | 5.0 | — | — | — | — | — | — | — | — |
| Example 80 | A-1 | 5.0 | — | — | B-1 | 1.0 | — | — | 5.0 | — | — | — | — | — | — | — | — |
| Example 81 | A-1 | 5.0 | — | — | B-1 | 1.0 | B-13 | 0.01 | 5.0 | — | — | — | — | — | — | — | — |
| Example 82 | A-1 | 5.0 | — | — | B-1 | 1.0 | — | — | 5.0 | — | — | — | — | — | — | — | — |
| Example 83 | A-1 | 5.0 | — | — | B-1 | 1.0 | — | — | 5.0 | C-1 | 1.0 | — | — | 1.0 | — | — | — |
| Example 84 | A-1 | 1.0 | — | — | B-1 | 0.1 | — | — | 10.0 | C-1 | 0.5 | — | — | 0.2 | — | — | — |
| Example 85 | A-1 | 5.0 | — | — | B-1 | 1.0 | — | — | 5.0 | — | — | — | — | — | D-7 | 1.0 | 1.0 |
| Example 86 | A-1 | 5.0 | — | — | B-1 | 1.0 | — | — | 5.0 | — | — | — | — | — | — | — | — |
| Example 87 | A-1 | 5.0 | — | — | B-1 | 1.0 | — | — | 5.0 | C-1 | 1.0 | — | — | 1.0 | D-1 | 1.0 | 1.0 |
| Example 88 | A-1 | 1.0 | — | — | B-1 | 0.1 | — | — | 10.0 | C-1 | 0.5 | — | — | 0.2 | — | — | — |
| Example 89 | A-6 | 5.0 | — | — | B-3 | 1.0 | — | — | 5.0 | C-3 | 1.0 | — | — | 1.0 | D-7 | 1.0 | 1.0 |
| Example 90 | A-6 | 5.0 | — | — | B-8 | 1.0 | — | — | 5.0 | C-3 | 1.0 | — | — | 1.0 | D-7 | 1.0 | 1.0 |
| Example 91 | A-6 | 5.0 | — | — | B-10 | 1.0 | — | — | 5.0 | C-3 | 1.0 | — | — | 1.0 | D-7 | 1.0 | 1.0 |
| Comparative Example 1 | A-2 | 5.0 | — | — | — | — | — | — | — | — | — | — | — | — | — | — | — |
| Comparative Example 2 | — | — | — | — | B-4 | 1.0 | — | — | — | — | — | — | — | — | — | — | — |
| Comparative Example 3 | a-1 | 5.0 | — | — | B-4 | 1.0 | — | — | — | — | — | — | — | — | — | — | — |
| Comparative Example 4 | A-2 | 5.0 | — | — | — | — | — | — | — | C-2 | 1.0 | — | — | — | — | — | — |

TABLE 4

Table 4 succession of Table 3

| | Composition of treatment liquid | | | | | | | | | | | |
|---|---|---|---|---|---|---|---|---|---|---|---|---|
| | E Anticorrosion agent | | F Organic acid and inorganic acid | | G Others | | | | | | Removability of | Suppression property of |
| | Type | Content % by mass | Type | Content % by mass | Type | Content % by mass | Water Content | pH before dilution | pH after dilution | Dilution rate | hydrophobic anticorrosion agent | copper surface roughness |
| Example 54 | — | — | — | — | — | — | Remainder | 13.5 | 11.5 | 100 | 9 | 5 |
| Example 55 | — | — | — | — | — | — | Remainder | 13.5 | 11.5 | 100 | 8 | 5 |
| Example 56 | — | — | — | — | — | — | Remainder | 13.5 | 11.5 | 100 | 7 | 5 |
| Example 57 | — | — | — | — | — | — | Remainder | 13.5 | 11.5 | 100 | 8 | 5 |
| Example 58 | — | — | — | — | — | — | Remainder | 13.5 | 11.5 | 100 | 8 | 5 |
| Example 59 | — | — | — | — | — | — | Remainder | 13.5 | 11.5 | 100 | 8 | 5 |
| Example 60 | — | — | — | — | — | — | Remainder | 13.5 | 11.5 | 100 | 8 | 5 |

TABLE 4-continued

Table 4 succession of Table 3

| | Composition of treatment liquid | | | | | | | | | | | |
|---|---|---|---|---|---|---|---|---|---|---|---|---|
| | E Anticorrosion agent | | F Organic acid and inorganic acid | | G Others | | | | | | Removability of | Suppression property of |
| | Type | Content % by mass | Type | Content % by mass | Type | Content % by mass | Water Content | pH before dilution | pH after dilution | Dilution rate | hydrophobic anticorrosion agent | copper surface roughness |
| Example 61 | — | — | — | — | — | — | Remainder | 13.5 | 11.5 | 100 | 8 | 5 |
| Example 62 | — | — | — | — | — | — | Remainder | 13.5 | 11.5 | 100 | 8 | 5 |
| Example 63 | — | — | — | — | — | — | Remainder | 13.5 | 11.5 | 100 | 8 | 5 |
| Example 64 | E-1 | 0.5 | — | — | — | — | Remainder | 13.5 | 11.5 | 100 | 6 | 7 |
| Example 65 | E-2 | 0.5 | — | — | — | — | Remainder | 13.5 | 11.5 | 100 | 6 | 7 |
| Example 66 | E-3 | 0.5 | — | — | — | — | Remainder | 13.5 | 11.5 | 100 | 6 | 8 |
| Example 67 | E-4 | 0.5 | — | — | — | — | Remainder | 13.5 | 11.5 | 100 | 6 | 7 |
| Example 68 | — | — | F-1 | 0.10 | — | — | Remainder | 13.4 | 11.2 | 100 | 7 | 5 |
| Example 69 | — | — | F-2 | 0.10 | — | — | Remainder | 13.4 | 11.2 | 100 | 7 | 5 |
| Example 70 | — | — | F-3 | 0.10 | — | — | Remainder | 13.4 | 11.2 | 100 | 7 | 5 |
| Example 71 | — | — | — | — | G-7 | 0.10 | Remainder | 13.4 | 11.2 | 100 | 5 | 5 |
| Example 72 | — | — | — | — | G-8 | 0.10 | Remainder | 13.4 | 11.2 | 100 | 5 | 5 |
| Example 73 | — | — | F-4 | 0.10 | — | — | Remainder | 13.4 | 11.2 | 100 | 7 | 5 |
| Example 74 | — | — | — | — | — | — | Remainder | 13.4 | 11.2 | 100 | 7 | 5 |
| Example 75 | — | — | — | — | G-1 | 0.01 | Remainder | 13.5 | 11.5 | 100 | 7 | 7 |
| Example 76 | — | — | — | — | G-2 | 0.01 | Remainder | 13.5 | 11.5 | 100 | 8 | 7 |
| Example 77 | — | — | — | — | G-3 | 0.01 | Remainder | 13.5 | 11.5 | 100 | 8 | 6 |
| Example 78 | — | — | — | — | G-4 | 0.01 | Remainder | 13.5 | 11.5 | 100 | 8 | 6 |
| Example 79 | — | — | — | — | G-5 | 0.01 | Remainder | 13.5 | 11.5 | 100 | 8 | 7 |
| Example 80 | — | — | — | — | G-6 | 0.01 | Remainder | 13.5 | 11.5 | 100 | 8 | 7 |
| Example 81 | — | — | — | — | — | — | Remainder | 13.5 | 11.5 | 100 | 8 | 7 |
| Example 82 | — | — | — | — | G-9 | 0.01 | Remainder | 13.5 | 11.5 | 100 | 8 | 7 |
| Example 83 | E-1 | 0.5 | — | — | — | — | Remainder | 13.5 | 11.5 | 100 | 9 | 7 |
| Example 84 | E-1 | 0.5 | — | — | — | — | Remainder | 12.8 | 10.5 | 100 | 5 | 8 |
| Example 85 | E-1 | 0.5 | — | — | — | — | Remainder | 13.5 | 11.5 | 100 | 8 | 7 |
| Example 86 | E-1 | 0.5 | F-2 | 0.10 | — | — | Remainder | 13.4 | 11.2 | 100 | 7 | 7 |
| Example 87 | E-1 | 0.5 | — | — | G-2 | 0.01 | Remainder | 13.5 | 11.5 | 100 | 10 | 9 |
| Example 88 | E-1 | 0.5 | — | — | G-2 | 0.01 | Remainder | 12.8 | 10.5 | 100 | 7 | 10 |
| Example 89 | E-3 | 0.5 | F-3 | 0.10 | G-5 | 0.01 | Remainder | 13.5 | 11.5 | 100 | 9 | 8 |
| Example 90 | E-3 | 0.5 | F-3 | 0.10 | G-5 | 0.01 | Remainder | 13.5 | 11.5 | 100 | 9 | 8 |
| Example 91 | E-3 | 0.5 | F-3 | 0.10 | G-5 | 0.01 | Remainder | 13.5 | 11.5 | 100 | 10 | 8 |
| Comparative Example 1 | — | — | — | — | — | — | Remainder | 13.5 | 11.6 | 100 | 1 | 2 |
| Comparative Example 2 | — | — | — | — | — | — | Remainder | 4.0 | 6.0 | 100 | 1 | 1 |
| Comparative Example 3 | — | — | — | — | — | — | Remainder | 13.5 | 11.5 | 100 | 1 | 1 |
| Comparative Example 4 | — | — | — | — | — | — | Remainder | 13.5 | 11.5 | 100 | 1 | 2 |

It was confirmed that, with the treatment liquid according to the embodiment of the present invention, the effect of the present invention was obtained.

It was confirmed that, in a case where the content of the specific compound was 1.0% to 10.0% by mass (preferably 2.5% to 10.0% by mass and more preferably 4.0% to 10.0% by mass) with respect to the total mass of the treatment liquid, the suppression property of the copper surface roughness was more excellent (comparison of Examples 1 to 5, and the like).

In addition, from the same comparison, it was confirmed that, in a case where the mass ratio of the specific compound to the sulfur-containing compound was more than 1.0, the suppression property of the copper surface roughness was more excellent (comparison of Examples 1 to 5, and the like).

It was confirmed that, in a case where the specific compound was an ethyltrimethylammonium salt, the suppression property of the copper surface roughness was more excellent (comparison of Examples 2 and 6 to 18, and the like).

It was confirmed that, in a case where the content of the sulfur-containing compound was 0.8% to 1.5% by mass with respect to the total mass of the treatment liquid, the effect of the present invention was more excellent (comparison of Examples 2 and 20 to 23, and the like).

It was confirmed that, in a case where the sulfur-containing compound included cysteine or tetramethylthiourea (preferably, included cysteine), the removability of the hydrophobic anticorrosion agent was more excellent (comparison of Examples 2 and 25 to 34, and the like).

It was confirmed that, in a case where the treatment liquid contained two or more kinds of sulfur-containing compounds (preferably, contained two sulfur-containing compounds), the removability of the hydrophobic anticorrosion agent was more excellent (comparison of Examples 2 and 38 to 40, and the like).

It was confirmed that, in a case where the treatment liquid contained the compound X, the removability of the hydrophobic anticorrosion agent was more excellent (comparison of Examples 2 and 41 to 48, and the like).

It was confirmed that, in a case where the content of the compound X was 0.5% to 5.0% by mass (preferably 1.0% to 1.5% by mass) with respect to the total mass of the treatment liquid, the removability of the hydrophobic anticorrosion agent was more excellent (comparison of Examples 2 and 41 to 43, and the like).

It was confirmed that, in a case where the treatment liquid contained two or more kinds of compounds X (preferably, contained two compounds X), the removability of the hydrophobic anticorrosion agent was more excellent (comparison of Examples 41, 46, and 53, and the like).

It was confirmed that, in a case where the treatment liquid contained the amine compound, the removability of the hydrophobic anticorrosion agent was more excellent (comparison of Examples 2 and 54 to 63, and the like).

It was confirmed that, in a case where the content of the amine compound was 0.5% to 1.5% by mass (preferably 1.0% to 1.5% by mass) with respect to the total mass of the treatment liquid, the removability of the hydrophobic anticorrosion agent was more excellent (comparison of Examples 54 to 56, and the like).

It was confirmed that, in a case where the treatment liquid contained the anticorrosion agent (preferably, the purine compound), the suppression property of the copper surface roughness was more excellent (comparison of Examples 2 and 64 to 67, and the like).

It was confirmed that, in a case where the treatment liquid contained at least one selected from the group consisting of the chelating agent and the inorganic acid, the removability of the hydrophobic anticorrosion agent was more excellent (comparison of Examples 2, 68 to 70, and 73, and the like).

It was confirmed that, in a case where the treatment liquid contained other components, the effect of the present invention was more excellent, and it was confirmed that, in a case where the treatment liquid contained at least one selected from the group consisting of the polymer and the antibacterial agent, the effect of the present invention was still more excellent (comparison of Examples 2, 71, 72, 75 to 80, and 82, and the like).

It was confirmed that, in a case where the mass ratio of the sulfur-containing compound to the compound X (mass of sulfur-containing compound/mass of compound X) was 1.0 to 2.0 (preferably 1.0 to 1.5), the removability of the hydrophobic anticorrosion agent was more excellent (comparison of Examples 41 to 43, and the like).

It was confirmed that, in a case where the mass ratio of the sulfur-containing compound to the amine compound (mass of sulfur-containing compound/mass of amine compound) was 1.0 to 2.0 (preferably 1.0 to 1.5), the removability of the hydrophobic anticorrosion agent was more excellent (comparison of Examples 54 to 56, and the like).

Example 92

A pattern substrate to which residues had been attached was produced by carrying out dry etching with reference to the description in paragraph 0084 of WO2020/049955 Å, and was cut in a size of 2 cm×1 cm so as to include a site to be observed. 50 mL of the treatment liquid of Example 2 was weighed in a glass beaker, and the above-described substrate was subjected to an immersion treatment at room temperature with a stirrer rotating at 250 rpm. The obtained substrate was observed with a scanning electron microscope (SEM), and the amount of residues was measured using image analysis software. As a result, it was confirmed that no residues were observed and that the treatment liquid of Example 2 also functioned as a cleaning liquid.

What is claimed is:

1. A treatment liquid comprising:

at least one specific compound selected from the group consisting of an ionic compound consisting of a quaternary ammonium cation having a total number of carbon atoms of 5 or more and an anion and an ionic compound consisting of a quaternary phosphonium cation having a total number of carbon atoms of 5 or more and an anion;

a sulfur-containing compound; and a solvent, wherein the treatment liquid comprises at least one compound X selected from the group consisting of ethylene glycol, propylene glycol, 1,3-butanediol, and 2-butoxyethanol.

2. The treatment liquid according to claim 1, wherein the specific compound has any one of a cation represented by Formula (1) or a cation represented by Formula (2), (1)

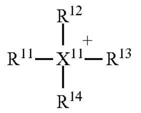

(2)

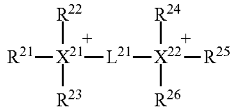

in Formula (1), $X^{11}$ represents a nitrogen atom or a phosphorus atom, $R^{11}$ to $R^{14}$ each independently represent an alkyl group which may have a substituent and may have —O—, here, a case where all of $R^{11}$ to $R^{14}$ represent the same group is excluded, and a total number of carbon atoms in $R^{11}$ to $R^{14}$ is 5 or more, in Formula (2), $X^{21}$ and $X^{22}$ each independently represent a nitrogen atom or a phosphorus atom, $L^{21}$ represents a divalent linking group, $R^{21}$ to $R^{26}$ each independently represent an alkyl group which may have a substituent and may have —O—, and a total number of carbon atoms in $R^{21}$ to $R^{26}$ and $L^{21}$ is 6 or more.

3. The treatment liquid according to claim 2, wherein $R^{11}$ to $R^{14}$ in Formula (1) each independently represent an unsubstituted alkyl group.

4. The treatment liquid according to claim 1, wherein the specific compound is an ethyltrimethylammonium salt.

5. The treatment liquid according to claim 1, wherein the specific compound includes at least one selected from the group consisting of an ionic compound consisting of a quaternary ammonium cation having a total number of carbon atoms of 8 or more and an anion and an ionic compound consisting of a quaternary phosphonium cation having a total number of carbon atoms of 8 or more and an anion.

6. The treatment liquid according to claim 1, wherein a mass ratio of the specific compound to the sulfur-containing compound is more than 1.0.

7. The treatment liquid according to claim 1, wherein the sulfur-containing compound includes at least one selected from the group consisting of a thiol compound and a salt of the thiol compound, a thioether compound, a thioketone compound, a thiourea compound, a disulfide compound, a polysulfide compound, and a sulfur-containing heterocyclic compound.

8. The treatment liquid according to claim 1, wherein the sulfur-containing compound includes at least one selected from the group consisting of a thiol compound and a salt of the thiol compound, and a thiourea compound.

9. The treatment liquid according to claim 1, wherein the sulfur-containing compound includes at least one selected from the group consisting of cysteine, cysteamine, N-acetylcysteine, thioglycerol, mercaptopropionic acid, mercaptosuccinic acid, meso-2,3-dimercaptosuccinic acid, mercaptotriazole, and tetramethylthiourea.

10. The treatment liquid according to claim 1, wherein the sulfur-containing compound includes cysteine.

11. The treatment liquid according to claim 1, wherein a mass ratio of the sulfur-containing compound to the compound X is 0.1 to 10.0.

12. The treatment liquid according to claim 1, further comprising:

an amine compound.

13. The treatment liquid according to claim 12, wherein the amine compound includes at least one selected from the group consisting of monoethanolamine and methyldiethanolamine.

14. The treatment liquid according to claim 12, wherein a mass ratio of the sulfur-containing compound to the amine compound is 1.0 to 10.0.

15. The treatment liquid according to claim 1, wherein a pH of the treatment liquid is 8.0 to 14.0.

16. The treatment liquid according to claim 1, wherein the treatment liquid is used for cleaning a semiconductor substrate which has been subjected to a chemical mechanical polishing treatment.

17. A cleaning method of a semiconductor substrate, comprising:

a cleaning step of cleaning a semiconductor substrate which has been subjected to a chemical mechanical polishing treatment using the treatment liquid according to claim 1.

18. A manufacturing method of a semiconductor element, comprising:

the cleaning method of a semiconductor substrate according to claim 17.

* * * * *